(12) United States Patent
Sakai et al.

(10) Patent No.: US 10,293,368 B2
(45) Date of Patent: May 21, 2019

(54) FILM-FORMING METHOD

(71) Applicant: SHARP KABUSHIKI KAISHA, Sakai, Osaka (JP)

(72) Inventors: Toshihiko Sakai, Sakai (JP); Takeshi Kamikawa, Sakai (JP); Masatomi Harada, Sakai (JP); Tokuaki Kuniyoshi, Sakai (JP); Liumin Zou, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/567,589

(22) PCT Filed: Feb. 24, 2016

(86) PCT No.: PCT/JP2016/055359
§ 371 (c)(1),
(2) Date: Oct. 18, 2017

(87) PCT Pub. No.: WO2016/170841
PCT Pub. Date: Oct. 27, 2016

(65) Prior Publication Data
US 2018/0161808 A1    Jun. 14, 2018

(30) Foreign Application Priority Data

Apr. 20, 2015   (JP) ................................ 2015-085852

(51) Int. Cl.
*C23C 14/04*   (2006.01)
*B05D 3/04*   (2006.01)
(Continued)

(52) U.S. Cl.
CPC ............ *B05D 3/0493* (2013.01); *C23C 14/04* (2013.01); *C23C 14/50* (2013.01); *C23C 16/04* (2013.01);
(Continued)

(58) Field of Classification Search
CPC .......... C23C 14/04; C23C 16/04; C23C 16/44
See application file for complete search history.

(56) References Cited

U.S. PATENT DOCUMENTS

2002/0053398 A1\* 5/2002 Miller ................... B32B 37/226
156/290
2004/0142108 A1\* 7/2004 Atobe ................... C23C 14/042
427/282
(Continued)

FOREIGN PATENT DOCUMENTS

JP  60-170915  *  9/1985
JP  2002-105622  *  4/2002
(Continued)

OTHER PUBLICATIONS

Navas, David, et al., "Templates as Shadow Masks to Tune the Magnetic Anisotropy in Nanostructured CoCrPt/Ti Bilayer Films". Advanced Materials Interfaces, 2015, 2, 1400551, pp. 1-8.*
(Continued)

*Primary Examiner* — Bret P Chen
(74) *Attorney, Agent, or Firm* — ScienBiziP, P.C.

(57) ABSTRACT

A film-forming method for forming a thin film on a substrate includes a contact step, an external force removal step, and a film-forming step. At the contact step (step B), the substrate 30 and a member 31 in contact with one surface of the substrate is stacked, and the substrate 30 and the member 31 in contact with one surface of the substrate are placed under vacuum while an external force is applied in a direction in which the substrate 30 and the member 31 in contact with one surface of the substrate are stacked. At the external force removal step (step C), the external force is removed at atmospheric pressure or under vacuum. At a film-forming step (step E), a thin film is formed on the one surface or the other surface of the substrate 30.

5 Claims, 19 Drawing Sheets

(51) Int. Cl.
  *C23C 14/50* (2006.01)
  *C23C 16/04* (2006.01)
  *C23C 16/44* (2006.01)
  *H01L 21/56* (2006.01)
  *H01L 21/67* (2006.01)
  *H01L 31/20* (2006.01)

(52) U.S. Cl.
  CPC .............. *C23C 16/44* (2013.01); *H01L 21/56* (2013.01); *H01L 21/67201* (2013.01); *H01L 21/67207* (2013.01); *H01L 31/202* (2013.01); *H01L 31/204* (2013.01); *Y02E 10/50* (2013.01); *Y02P 70/521* (2015.11)

(56) References Cited

U.S. PATENT DOCUMENTS

| | | | | |
|---|---|---|---|---|
| 2005/0166842 | A1* | 8/2005 | Sakamoto | C23C 14/042 118/721 |
| 2006/0014087 | A1* | 1/2006 | Wittenberg | C23C 14/0005 430/7 |
| 2007/0209437 | A1* | 9/2007 | Xue | B81B 3/0032 73/514.31 |
| 2008/0073982 | A1* | 3/2008 | Ono | G03F 7/70725 310/12.06 |
| 2009/0283723 | A1* | 11/2009 | Meyer-Friedrichsen | C08G 61/00 252/500 |
| 2010/0193912 | A1* | 8/2010 | Speakman | G03F 1/56 257/618 |
| 2011/0001126 | A1* | 1/2011 | Kamikawa | H01L 21/02389 257/14 |
| 2011/0097533 | A1* | 4/2011 | Li | C23C 16/029 428/68 |
| 2011/0207328 | A1* | 8/2011 | Speakman | H01L 51/0011 438/694 |
| 2014/0165906 | A1* | 6/2014 | Grant | H01J 37/3171 118/500 |
| 2014/0203247 | A1 | 7/2014 | Kim | |
| 2015/0056427 | A1* | 2/2015 | Guillemette | C25D 5/34 428/209 |

FOREIGN PATENT DOCUMENTS

| | | | |
|---|---|---|---|
| JP | 2015-014024 A | | 1/2015 |
| JP | 2015-124394 | * | 7/2015 |

OTHER PUBLICATIONS

Fukui, Takashi, et al., "Lateral quantum well wires fabricated by selective metalorganic chemical vapor deposition". Appl/Phys. Lett. 57 (12), Sep. 17, 1990, pp. 1209-1211.*

Arkwright, John. et al., "Deterministic control of thin film thickness in physical vapor deposition systems using a multi-aperture mask ". Optics Express, Apr. 4, 2005, vol. 13, No. 7, pp. 2731-2741.*

* cited by examiner

FILM-FORMING METHOD

TECHNICAL FIELD

The present invention relates to a film-forming method for forming a thin film on a substrate.

BACKGROUND ART

Hitherto, various techniques of forming a thin film on a substrate for manufacturing a solar cell, a display panel, or the like have been proposed. Japanese Unexamined Patent Application Publication No. 2015-14024 discloses a sputtering apparatus that uses a target to form a film on a substrate through a metal mask in a vacuum room. The sputtering apparatus forms the film in a state where the substrate and the metal mask that is provided on a front surface side of the substrate are in close contact with each other by a magnet that is provided on a back surface side of the substrate.

SUMMARY OF INVENTION

When a metal mask, a substrate, and a magnet are conveyed in a stacked state to a load lock chamber to form a film, the magnet needs to be conveyed together with the metal mask and the substrate. Thus, a magnet is required in each substrate, and a load on a conveyance apparatus that conveys the metal mask, the substrate, and the magnet increases, thus causing increase in a size and cost of the conveyance apparatus. When the metal mask, the substrate, and the magnet are stacked in a film-forming room so that the metal mask and the substrate are in close contact with each other, the required number of magnets increases as the number of film-forming rooms increases, thus causing increase in cost.

An object of the invention is to provide a technique that can reduce cost required for a film-forming process for forming a thin film on a substrate and achieve reduction in a size of an apparatus that executes the film-forming process.

A film-forming method according to the invention is a film-forming method for forming a thin film on a substrate, and the method includes: a contact step of stacking the substrate and a member in contact with one surface of the substrate and placing the substrate and the member in contact with one surface of the substrate under vacuum while an external force is applied in a direction in which the substrate and the member in contact with one surface of the substrate are stacked; an external force removal step of removing the external force at atmospheric pressure or under vacuum; and a film-forming step of forming a thin film on the one surface or the other surface of the substrate.

ADVANTAGEOUS EFFECTS OF INVENTION

According to a configuration of the invention, it is possible to reduce cost required for a film-forming process for forming a thin film on a substrate and reduce a size of an apparatus that executes the film-forming process.

DESCRIPTION OF EMBODIMENTS

Figure 1:
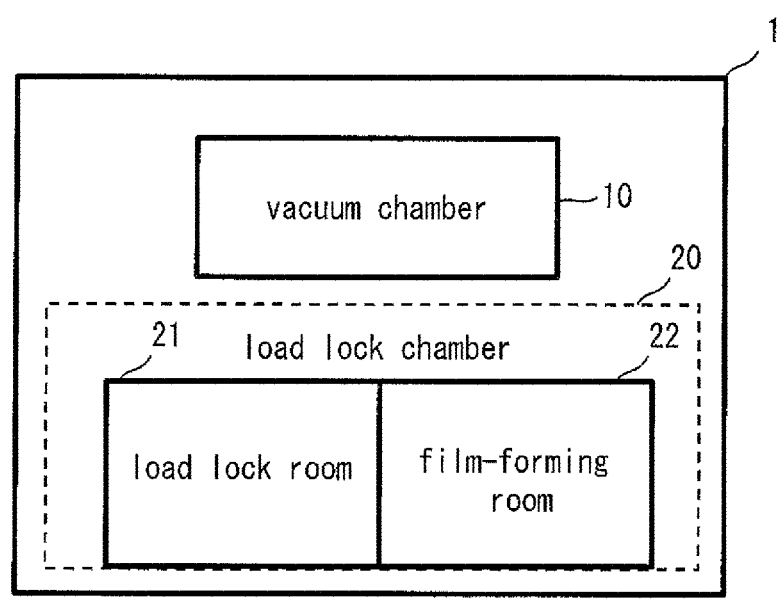
FIG. 1 is a schematic view illustrating a film-forming apparatus that carries out a film-forming method of a first embodiment.

A film-forming method according to an embodiment of the invention is a film-forming method for forming a thin film on a substrate, and the method includes: a contact step of stacking the substrate and a member in contact with one surface of the substrate and placing the substrate and the member in contact with one surface of the substrate under vacuum while an external force is applied in a direction in which the substrate and the member in contact with one surface of the substrate are stacked; an external force removal step of removing the external force at atmospheric pressure or under vacuum; and a film-forming step of forming a thin film on the one surface or the other surface of the substrate.

According to a first configuration, the external force is applied to the substrate and the member in contact with one surface of the substrate in a direction in which they are stacked and the substrate and the member in contact with one surface of the substrate are placed under vacuum, so that the one surface of the substrate and a surface of the member in contact with the one surface of the substrate are in close contact with each other. Since the external force is removed at atmospheric pressure or under vacuum and the thin film is formed on the one surface or the other surface of the substrate, the external force does not need to be always applied. That is, the external force is only required to be applied in the direction in which the substrate and the member in contact with one surface of the substrate are stacked at least at the contact step. Thus, compared to a configuration in which the external force is always applied from conveyance of the substrate to film formation so that the substrate and the member in contact with one surface of the substrate are in close contact with each other, it is possible to reduce cost required for a film-forming process and achieve reduction in a size of an apparatus that executes the film-forming process.

A second configuration may be provided in which, in the first configuration, the member in contact with one surface of the substrate is a metal mask having an opening; at the contact step, a magnet is arranged on a side of the other surface of the substrate and the external force is applied while the substrate is held between the metal mask and the magnet; at the external force removal step, the external force is removed by separating the magnet and the metal mask; and at the film-forming step, the thin film is formed in a region of the one surface of the substrate, the region corresponding to an area where the opening of the metal mask is provided.

According to the second configuration, since the magnet needs to be provided only at the contact step, it is not required that a magnet is provided in each step of the film-forming process or a magnet is conveyed together with the metal mask and the substrate.

A third configuration may be provided in which, in the second configuration, at the contact step, a non-magnetic member is further arranged in a stacked manner to contact the other surface of the substrate; and the external force is applied in a direction in which the metal mask, the substrate, and the non-magnetic member are stacked while the substrate and the non-magnetic member are held between the metal mask and the magnet.

According to the third configuration, the external force is applied to the metal mask, the substrate, and the non-magnetic member in a direction in which they are stacked and the metal mask, the substrate, and the non-magnetic member are placed under vacuum, so that contact surfaces of the metal mask, the substrate, and the non-magnetic member are in close contact with each other. Thus, compared to a case where the non-magnetic member is not provided, it is possible to separate and convey the magnet by holding a portion of the non-magnetic member. Further, it is possible to prevent the thin film from being formed to extend onto the surface of the substrate on which the non-magnetic member is provided.

A fourth configuration may be provided in which, in the second or third configuration, at the film-forming step, the thin film is formed on the substrate by using a chemical vapor deposition method; and the magnet and the magnetic member are separated at the external force removal step before the film-forming step.

According to the fourth configuration, since the magnet is separated from the magnetic member before the film-forming step with use of the chemical vapor deposition method, influence of a magnetic field by the magnet is less likely to be given during the film formation and it is possible to uniformly form the thin film on the substrate.

A fifth configuration may be provided so that, in the first configuration, the member in contact with one surface of the substrate is a non-magnetic member made of a non-magnetic material; at the contact step, a magnetic member is further arranged in a stacked manner to contact the other surface of the substrate, a magnet is arranged to contact the non-magnetic member, and the external force is applied in a direction in which the magnetic member, the substrate, and the non-magnetic member are stacked while the substrate and the non-magnetic, member are held between the magnet and the magnetic member; at the external force removal step, the external force is removed by separating the magnetic member and the magnet from the substrate and the non-magnetic member; and at the film-forming step, the thin film is formed on the other surface of the substrate.

According to the fifth configuration, since the thin film is formed on the other surface of the substrate while the non-magnetic member is in close contact with the one surface of the substrate, it is possible to prevent the thin film from extending onto the one surface side of the substrate.

A film-forming apparatus according to an embodiment of the invention is a film-forming apparatus that forms a thin film on a substrate, and executes at least the contact step of the film-forming method according to any of the first to fifth configurations (sixth configuration).

Hereinafter, embodiments of the invention will be specifically described with reference to drawings. The same or corresponding parts in the drawings are given the same reference signs, and description thereof will not be repeated.

A film-forming method according to each embodiment of the invention is able to be used for steps of forming a thin film on a substrate for manufacturing a solar cell, a display panel, a touch panel, or the like, for example. A film-forming method when one thin film is formed on the substrate will be described below.

First Embodiment (Configuration)

FIG. 1 is a schematic view illustrating a film-forming apparatus that carries out a film-forming method of a first embodiment. As illustrated in FIG. 1, a film-forming apparatus 1 includes a vacuum chamber 10 and a load lock chamber 20.

The vacuum chamber 10 includes an exhaust device (not illustrated) and is exhausted by the exhaust device until reaching a predetermined degree of vacuum.

The load lock chamber 20 includes a load lock room 21 and a film-forming room 22. A not-illustrated conveyance room is provided between the load lock room 21 and the film-forming room 22, and the load lock room 21, the film-forming room 22, and the conveyance room (not illustrated) are separated by a gate valve. A conveyance robot (not illustrated) is provided in the conveyance room (not illustrated) and the conveyance robot conveys a substrate between the load lock room 21 and the film-forming room 22.

Each of the load lock room 21, the film-forming room 22, and the conveyance room (not illustrated) includes an exhaust device (not illustrated) and is exhausted by the exhaust device until reaching the predetermined degree of vacuum.

The film-forming room 22 is used to form a thin film on the substrate by a sputtering method, an EB (Electron Beam) vapor deposition method, a CVD method (such as a plasma CVD method or a Cat-CVD (Catalytic Chemical Vapor Deposition)), or the like.

Figure 2:
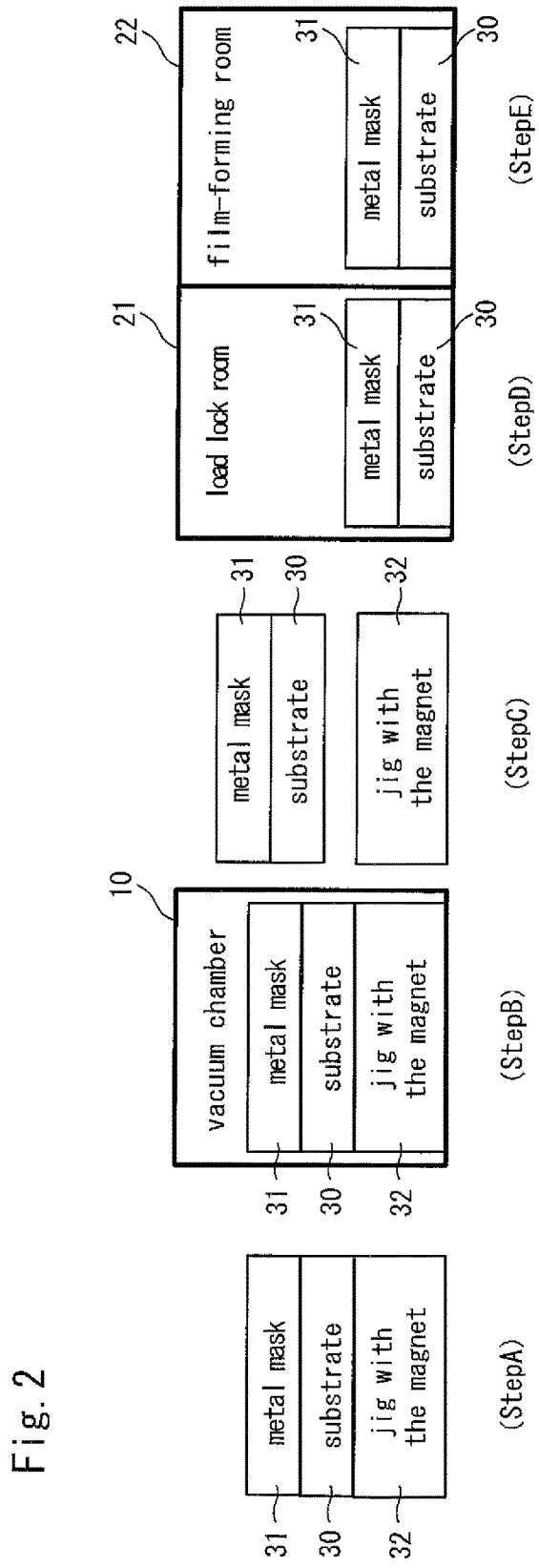
FIG. 2 is an outline schematic view illustrating steps of the film-forming method in the first embodiment.

Next, a film-forming method using the film-forming apparatus 1 will be described. FIG. 2 is an outline schematic view illustrating steps of the film-forming method in the present embodiment. Though not illustrated, the steps are connected to each other by a conveyance belt, such as a conveyor, or a conveyance robot.

(Step A)

In the present step, a jig with a magnet 32, a substrate 30, and a metal mask 31 (an example of a member in contact with one surface of the substrate) are arranged to be stacked in this order at atmospheric pressure and a set of them is conveyed to a step B.

The metal mask 31 is made of a magnetic material, for example, such as stainless steel, copper, nickel, an alloy including nickel (for example, such as SUS430, 42 alloy, or Invar material), or molybdenum, and has a plurality of openings (not illustrated). The metal mask 31 is arranged to contact a front surface of the substrate 30.

The jig with the magnet 32 includes a magnet member and a support member (both of which are not illustrated) that supports the magnet member. The magnet member may be formed by, for example, a magnet whose area is substantially equal to an area of a back surface of the substrate 30 or may be obtained by combining a plurality of magnets whose area is smaller than the area of the back surface of the substrate 30. The magnet member is formed by, for example, a neodymium magnet, a ferrite magnet, a samarium cobalt magnet, or the like. The jig with the magnet 32 is arranged so that the magnet member contacts the back surface of the substrate 30.

(Step B: Example of Contact Step)

The conveyed set of the metal mask 31, the substrate 30, and the jig with the magnet 32 is put in the vacuum chamber 10 and the vacuum chamber 10 is exhausted until reaching the predetermined degree of vacuum.

By a magnetic force between the metal mask 31 and the jig with the magnet 32, an external force in a magnetic force direction is applied to each contact surface of the metal mask 31, the substrate 30, and the jig with the magnet 32. Further, air in each contact surface of the metal mask 31, the substrate 30, and the jig with the magnet 32 is exhausted. Thereby, the contact surfaces of the metal mask 31 and the substrate 30 are in close contact with each other.

Note that, the adhesion in the present specification is a state where at least when vibration is applied in an in-plane direction of the substrate 30, the contact surfaces of the metal mask 31 and the substrate 30 are not shifted in the in-plane direction.

(Step C: Example of External Force Removal Step)

After the step B, the vacuum chamber 10 is opened to the air, the set of the metal mask 31, the substrate 30, and the jig with the magnet 32 is taken out from the vacuum chamber 10, and the jig with the magnet 32 is separated from the substrate 30. Then, the metal mask 31 and the substrate 30 are conveyed to the load lock room 21. Thereby, while the external force by the magnetic force is removed, the metal mask 31 and the substrate 30 in close contact with each other are conveyed to the load lock room 21.

(Step D)

When the metal mask 31 and the substrate 30 are conveyed to the load lock room 21, the load lock room 21 is exhausted until reaching the predetermined degree of vacuum. Then, the gate valve of the load lock room 21 and the film-forming room 22 is opened and the metal mask 31 and the substrate 30 are conveyed to the film-forming room 22 by the conveyance robot (not illustrated).

(Step E: Example of Film-Forming Step)

When the metal mask 31 and the substrate 30 are conveyed to the film-forming room 22, with a sputtering method, an EB (Electron Beam) vapor deposition method, or a CVD method (such as a plasma CVD method or a Cat-CVD (Catalytic Chemical Vapor Deposition)), a thin film is formed in a region, not covered with the metal mask 31, on the front surface of the substrate 30 in the film-forming room 22.

In the first embodiment described above, at the step B, the substrate 30 and the metal mask 31 are in close contact with each other in a vacuum by the magnetic force between the metal mask 31 and the jig with the magnet 32. After that, even when the jig with the magnet 32 is separated from the substrate 30 at atmospheric pressure and the external force by the magnetic force is removed at the step C, the substrate 30 and the metal mask 31 keep in close contact with each other. Thus, the jig with the magnet 32 does not need to be conveyed together with the metal mask 31 and the substrate 30, so that no load is applied to the conveyance belt or the conveyance robot (not illustrated) for conveying the substrate 30. In addition, it is not necessary to provide the jig with the magnet 32 in the load lock room 21 or the film-forming room 22 in the example above. Thus, it is possible to reduce the number of jigs with magnets 32 and achieve cost reduction compared to a case where the jig with the magnet 32 is provided in each of the load lock room 21 and the film-forming room 22 so that the metal mask 31 and the substrate 30 are in close contact with each other.

Second Embodiment

Though an example in which a film is formed by using the metal mask 31 has been described in the first embodiment, the present embodiment is different from the first embodiment in that a film is formed without using a metal mask. A configuration different from that of the first embodiment will be mainly described below.

Figure 3:
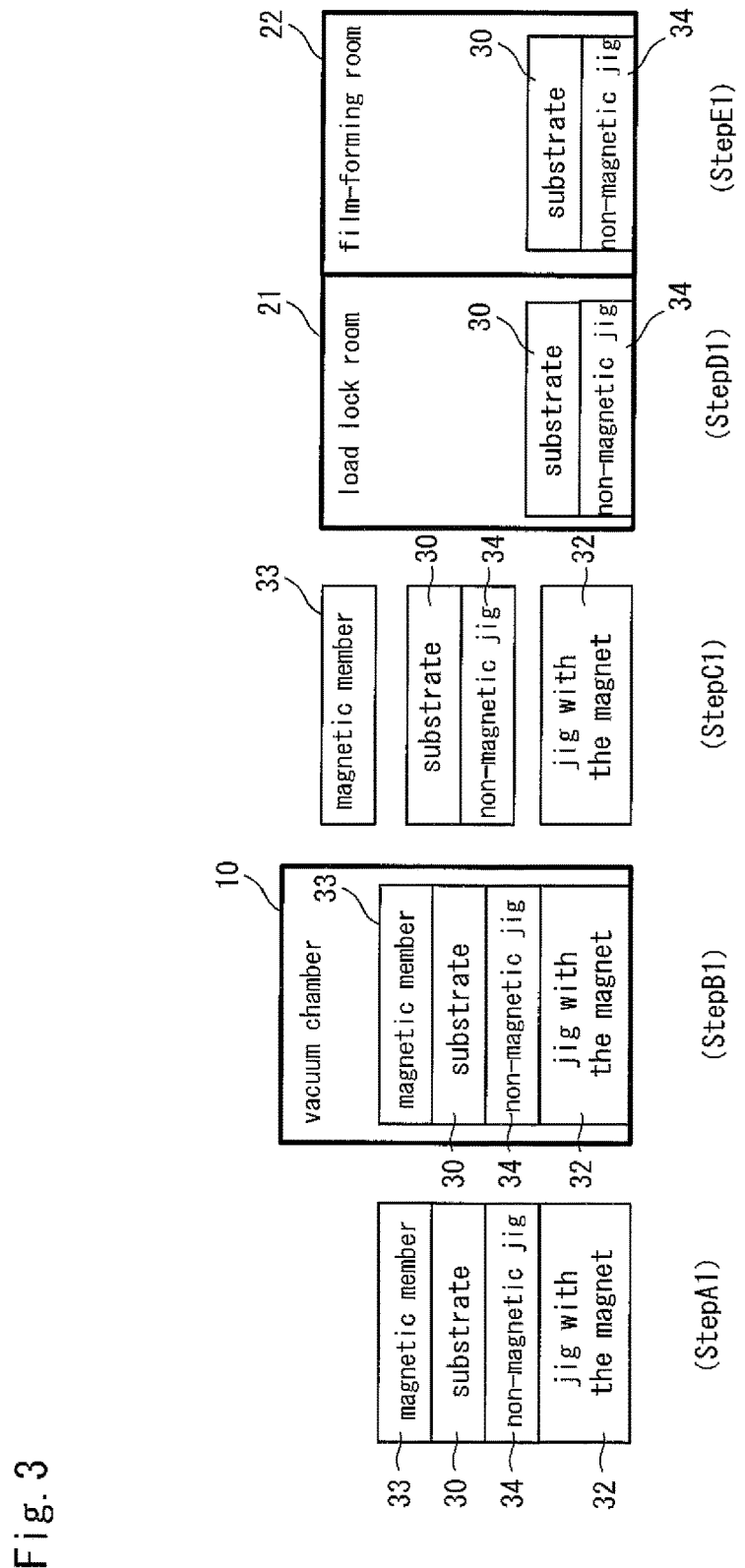
FIG. 3 is an outline schematic view illustrating steps of a film-forming method in a second embodiment.

FIG. 3 is an outline schematic view illustrating steps of a film-forming method of the present embodiment. Components similar to those of the first embodiment will be given the same reference signs as those of the first embodiment in FIG. 3.

(Step A1)

In the present embodiment, first, the jig with the magnet 32, a non-magnetic jig (an example of the member in contact with one surface of the substrate) 34, the substrate 30, and a magnetic member 33 are stacked in this order at atmospheric pressure and conveyed to the vacuum chamber 10.

As a material of the magnetic member 33, metal similar to the metal mask 31 described above is able to be used. The non-magnetic jig 34 is made of a non-magnetic material, for example, such as glass, ceramic, or non-magnetic metal, and is arranged on the back surface side of the substrate 30.

(Step B1: Example of Contact Step)

When a set of the magnetic member 33, the substrate 30, the non-magnetic jig 34, and the jig with the magnet 32 is conveyed to the vacuum chamber 10, the vacuum chamber 10 is exhausted until reaching the predetermined degree of vacuum. By a magnetic force between the magnetic member 33 and the jig with the magnet 32, an external force in a magnetic force direction is applied to each contact surface of the magnetic member 33, the substrate 30, the non-magnetic jig 34, and the jig with the magnet 32. Further, air in each contact surface of the magnetic member 33, the substrate 30, the non-magnetic jig 34, and the jig with the magnet 32 is exhausted. Thereby, the contact surfaces of the magnetic member 33, the substrate 30, and the non-magnetic jig 34 are in close contact with each other.

(Step C1: External Force Removal Step)

After the step B1, the vacuum chamber 10 is opened to the air, the set of the magnetic member 33, the substrate 30, the non-magnetic jig 34, and the jig with the magnet 32 is taken out from the vacuum chamber 10. Then, the magnetic member 33 and the jig with the magnet 32 are separated from the substrate 30 and the non-magnetic jig 34. After that, the substrate 30 and the non-magnetic jig 34 are conveyed to the load lock room 21. Thereby, while the external force by the magnetic force is removed, the substrate 30 and the non-magnetic jig 34 keep in close contact with each other.

(Step D1)

When the substrate 30 and the non-magnetic jig 34 are conveyed, to the load lock room 21, the load lock room 21 is exhausted until reaching the predetermined degree of vacuum. Then, the gate valve provided between the load lock room 21 and the film-forming room 22 is opened and the substrate 30 and the non-magnetic jig 34 are conveyed to the film-forming room 22 by the conveyance robot (not illustrated).

(Step E1: Example of Film-Forming Step)

When, the substrate 30 and the non-magnetic jig 34 are conveyed to the film-forming room 22, with a sputtering method, an EB vapor deposition method, or a CVD method (such as a plasma CVD method or a Cat-CVD), a thin film is formed on the entire front surface of the substrate 30 in the film-forming room 22.

In the second embodiment described above, since the non-magnetic jig 34 is arranged on the back surface of the substrate 30 in close contact with each other during the film formation, it is possible to prevent the thin film from being formed to extend onto the back surface side of the substrate 30.

Third Embodiment

Though the method for forming a film by using the vacuum chamber and the load lock chamber has been described in the first and second embodiments above, a method for forming a film without using a vacuum chamber will be described in the present embodiment. A configuration different from that of the first or second embodiment will be mainly described below.

Figure 4:
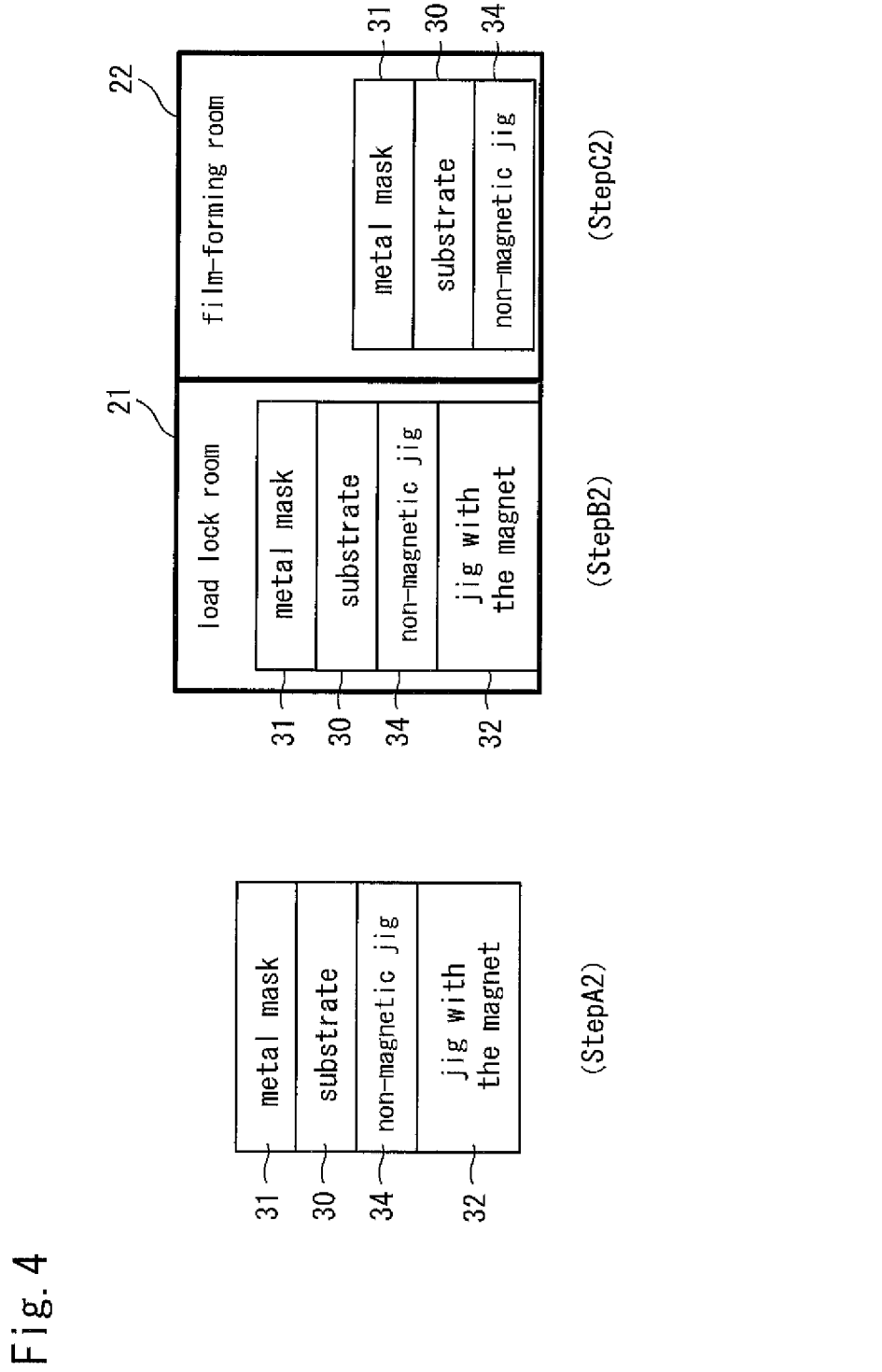
FIG. 4 is an outline schematic view illustrating steps of a film-forming method in a third embodiment.

FIG. 4 is an outline schematic view illustrating steps of a film-forming method of the present embodiment. Components similar to those of the first embodiment will be given the same reference signs as those of the first or second embodiment in FIG. 4.

(Step A2)

In the present embodiment, first, the jig with the magnet 32, the non-magnetic jig 34, the substrate 30, and the metal mask 31 are stacked in this order at atmospheric pressure and are conveyed to the load lock room 21.

(Step B2: Example of Contact Step)

When a set of the metal mask 31, the substrate 30, the non-magnetic jig 34, and the jig with the magnet 32 is conveyed to the load lock room 21, the load lock room 21 is exhausted until reaching the predetermined degree of vacuum. By a magnetic force between the metal mask 31 and the jig with the magnet 32, an external force in a magnetic force direction is applied to each contact surface of the metal mask 31, the substrate 30, the non-magnetic jig 34, and the jig with the magnet 32. Further, air in each contact surface of the metal mask 31, the substrate 30, the non-magnetic jig 34, and the jig with the magnet 32 is exhausted. Thereby, the contact surfaces of the magnetic member 33, the substrate 30, and the non-magnetic jig 34 are in close contact with each other.

Then, the gate valve provided between the load lock room 21 and the film-forming room 22 is opened and only the metal mask 31, the substrate 30, and the non-magnetic jig 34 are conveyed to the film-forming room 22 by the conveyance robot (not illustrated). Thereby, while the external force by the magnetic force between the jig with the magnet 32 and the metal mask 31 is removed in the vacuum state, the metal mask 31, the substrate 30, and the non-magnetic jig 34 keep in close contact with each other.

(Step C2)

When the metal mask 31, the substrate 30, and the non-magnetic jig 34 are conveyed to the film-forming room 22, with a sputtering method, an EB (Electron Beam) vapor deposition method, or a CVD method (such as a plasma CVD method or a Cat-CVD (Catalytic Chemical Vapor Deposition)), a thin film is formed in a region, not covered with the metal mask 31, on the front surface of the substrate 30 in the film-forming room 22.

In the third embodiment described above, even when the jig with the magnet 32 is separated from the non-magnetic jig 34 in the load lock room 21 at the step B2, the metal mask 31, the substrate 30, and the non-magnetic jig 34 are conveyed to the film-forming room 22 while keeping in close contact with each other. Thus, it is possible to form the film at an appropriate position on the substrate 30 without causing a positional shift of the metal mask 31 and the substrate 30 at the step C2. Since the jig with the magnet 32 is separated from the non-magnetic jig 34 before the film formation, it is possible to uniformly form a film without being affected by a magnetic field by the jig with the magnet 32 during the film formation, in particular, when the film is formed by using the plasma CVD method. Further, since it is possible to form the film while the non-magnetic jig 34 is in close contact with the substrate 30, it is possible to prevent the thin film from being formed to extend onto the surface of the substrate 30, in which the non-magnetic jig 34 is provided.

Fourth Embodiment

The present embodiment is different from the first to third embodiments described above in that the contact step is performed in the film-forming room and that the external force removal step is performed after the film-forming step. A film-forming method of the present embodiment will be specifically described below.

Figure 5:
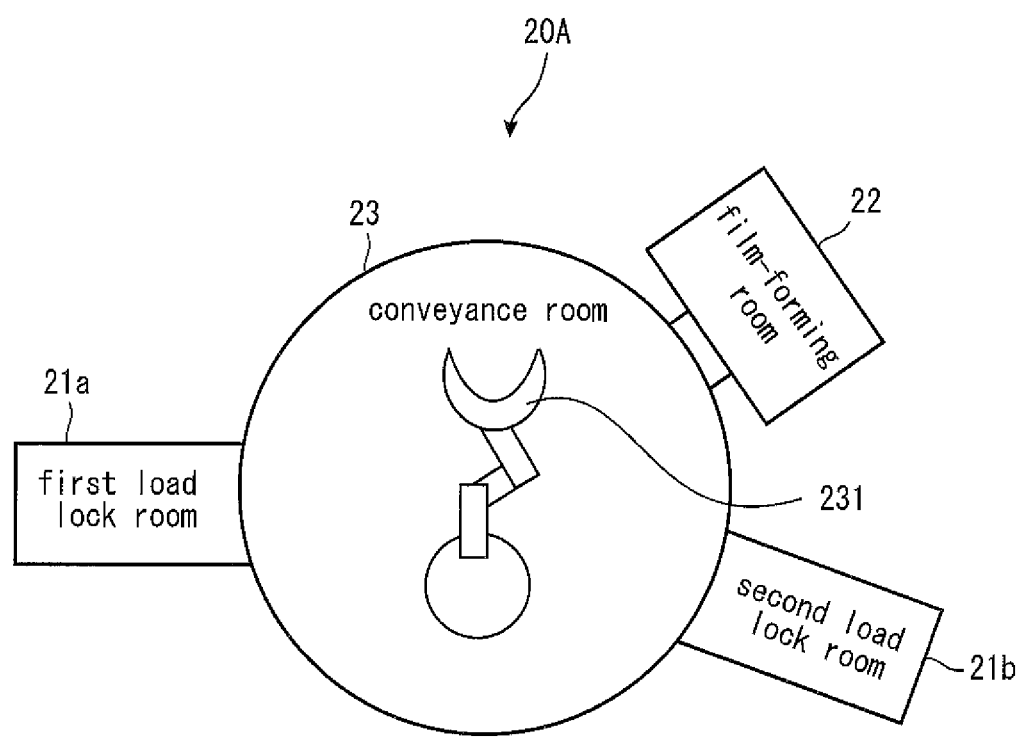
FIG. 5 is a schematic view illustrating a film-forming apparatus in a fourth embodiment.

FIG. 5 is a schematic view illustrating a film-forming apparatus in the present embodiment. As illustrated in FIG. 5, a film-forming apparatus 20A includes a first load lock room 21a, a second load lock room 21b, the film-forming room 22, and a conveyance room 23.

The conveyance room 23 has a hollow cylindrical shape. A conveyance robot 231 is provided inside the conveyance room 23.

The first load lock room 21a, the second load lock room 21b, and the film-forming room 22 are arranged radially around the conveyance room 23. Each of the first load lock room 21a, the second load lock room 21b, and the film-forming room 22 is connected to the conveyance room 23 and is separated from the conveyance room 23 by the gate valve.

Each of the first load lock room 21a, the second load lock room 21b, the conveyance room 23, and the film-forming room 22 is exhausted by an exhaust device (not illustrated) until reaching the predetermined degree of vacuum.

The first load lock room 21a and the second load lock room 21b are used to insert or remove the substrate 30 in or from the film-forming apparatus 20A.

The film-forming room 22 includes the jig with the magnet 32. In the film-forming room 22, the jig with the magnet 32 is arranged at a position where the substrate 30 is arranged.

Figure 6:
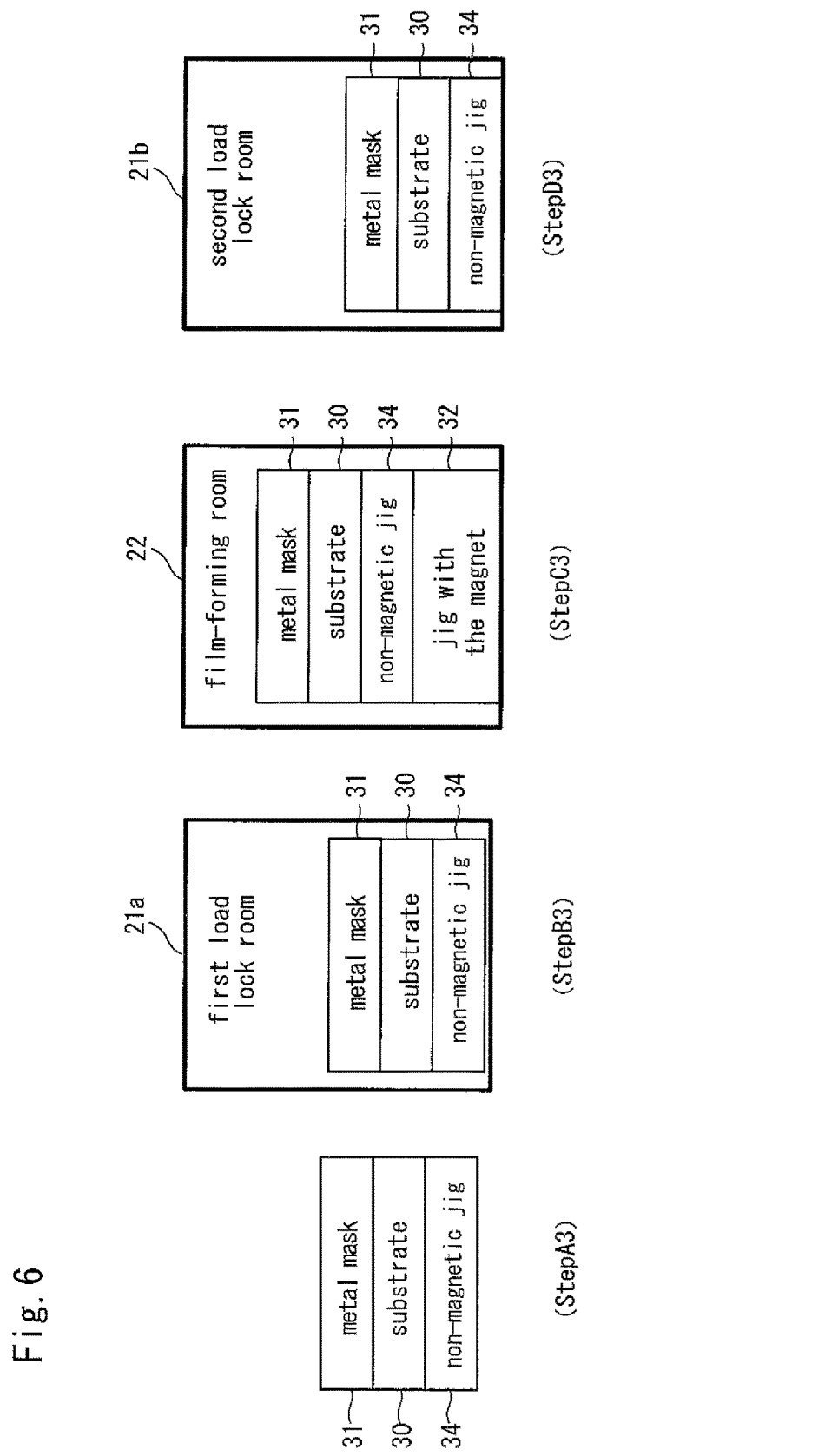
FIG. 6 is an outline schematic view illustrating steps of a film-forming method in the fourth embodiment.

FIG. 6 is an outline schematic view illustrating steps of a film-forming method of the present embodiment. Components similar to those of the first embodiment will be given the same reference signs as those of the first embodiment in FIG. 6.

(Step A3)

In the present embodiment, first, the non-magnetic jig 34, the substrate 30, and the metal mask 31 are stacked in this order at atmospheric pressure and are conveyed to the film-forming apparatus 20A. Note that, in the present embodiment, since the metal mask 31, the substrate 30, and the non-magnetic jig 34 are stacked in the atmosphere, when a set of them is conveyed, a position of the metal mask 31 may be shifted. Thus, for example, a pin may be provided at an end of the non-magnetic jig 34 in a region in which the substrate 30 is placed on the non-magnetic jig 34 and a pin hole corresponding to the pin of the non-magnetic jig 34 may be provided in the metal mask 31. When the metal mask 31, the substrate 30, and the non-magnetic jig 34 are stacked, they may be conveyed after fitting the pin of the non-magnetic jig 34 and the pin hole of the metal mask 31.

(Step B3)

When the set of the metal mask 31, the substrate 30, and the non-magnetic jig 34 is conveyed to the film-forming apparatus 20A, the set is placed in the first load lock room 21a and the first load lock room 21a is exhausted until reaching the predetermined degree of vacuum.

Then, the gate valve provided between the first load lock room 21a and the film-forming room 22 is opened and the metal mask 31, the substrate 30, and the non-magnetic jig 34 are conveyed to the film-forming room 22 by the conveyance robot 231.

(Step C3: Example of Contact Step, Film-Forming Step)

The set of the metal mask 31, the substrate 30, and the non-magnetic jig 34 conveyed to the film-forming room 22 is arranged on the jig with the magnet 32 that is arranged in advance in the film-forming room 22. Since the interior of the film-forming room 22 is in the vacuum state, air in each contact surface of the metal mask 31, the substrate 30, the non-magnetic jig 34, and the jig with the magnet 32 is exhausted. Moreover, by a magnetic force between the metal mask 31 and the jig with the magnet 32, an external force in a magnetic force direction is applied to each contact surface of the metal mask 31, the substrate 30, the non-magnetic jig 34, and the jig with the magnet 32. As a result, the contact surfaces of the metal mask 31, the substrate 30, and the non-magnetic jig 34 are in close contact with each other.

After that, with a sputtering method, an EB vapor deposition method, or a CVD method (such as a plasma CVD method or a Cat-CVD), a thin film is formed in a region, not covered with the metal mask 31, on the front surface of the substrate 30.

(Step D3: Example of External Force Removal Step)

After the film formation, the gate valve provided between the second load lock room 21b, the conveyance; room 23, and the film-forming room 22 is opened and the metal mask 31, the substrate 30, and the non-magnetic jig 34 are conveyed to the second load lock room 21b by the conveyance robot 231. That is, in the present embodiment, after the film formation, the jig with the magnet 32 is separated from the substrate 30 and the external force by the magnetic force between the metal mask 31 and the jig with the magnet 32 is removed in the vacuum state.

Note that, though an example in which the film-forming apparatus 20A includes two load lock rooms has been described in the present embodiment, one load lock room may be provided. For example, when only the first load lock room 21a is provided, the metal mask 31, the substrate 30, and the non-magnetic jig 34 may be conveyed to the first load lock room 21a by the conveyance robot 231 after the film formation in the film-forming room 22.

In the fourth embodiment described above, the film-forming room 22 includes the jig with the magnet 32. In the film-forming room 22, the contact surfaces of the metal mask 31, the substrate 30, the non-magnetic jig 34, and the jig with the magnet 32 are in close contact with each other. Thus, it is only required that the jig with the magnet 32 is provided in the film-forming room 22, and the jig with the magnet 32 does not need to be conveyed with the substrate 30. This makes it possible to reduce a load applied to the conveyance belt or the conveyance robot for conveying the substrate 30 and achieve reduction in a size and weight of the conveyance belt or the conveyance robot.

APPLICATION EXAMPLES

The film-forming method when one thin film is formed on the front surface of the substrate 30 has been described in the first to fourth embodiments above. A method for forming a plurality of thin films on a substrate by applying the film-forming method according to each embodiment of the first to fourth embodiments will be described below by taking manufacture of a solar cell (photoelectric conversion element) illustrated in FIG. 7 as an example.

Here, a schematic configuration of the solar cell (photoelectric, conversion element) illustrated in FIG. 7 will be described. A photoelectric conversion element 100 includes a semiconductor substrate 101, an antireflection film 102, a passivation film 103, an n-type amorphous semiconductor layer 104, and a p-type amorphous semiconductor layer 105. Note that, though not illustrated in the figure, an electrode is provided on each of the n-type amorphous semiconductor layer 104 and the p-type amorphous semiconductor layer 105.

The semiconductor substrate 101 is formed by, for example, an n-type monocrystalline silicon substrate. The semiconductor substrate 101 has a thickness of, for example, 100 to 150 μm. Note that, though a texture structure is not formed on both surfaces of the semiconductor substrate 101 in the present example, the texture structure may be formed on both surfaces of the semiconductor substrate 101.

The antireflection film 102 is arranged in contact with one of the surfaces of the semiconductor substrate 101. The surface on which the antireflection film 102 is formed of the surfaces of the semiconductor substrate 1 is referred to as a light-receiving surface.

The passivation film 103 is arranged in contact with the surface (hereinafter, back surface) opposite to the light-receiving surface of the semiconductor substrate 101.

The n-type amorphous semiconductor layer 104 and the p-type amorphous semiconductor layer 105 are arranged in contact with the passivation film 103. The n-type amorphous semiconductor layer 104 and the p-type amorphous semiconductor layer 105 are alternately arranged in an in-plane direction of the semiconductor substrate 101.

The antireflection film 102 is formed by, for example, a silicon nitride film, and has a film thickness of, for example, 60 nm.

The passivation film 103 is formed by, for example, i-type amorphous silicon, and has a film thickness of, for example, 10 nm.

The n-type amorphous semiconductor layer 104 has an n-type conductivity and is an amorphous semiconductor layer containing hydrogen. The n-type amorphous semiconductor layer 104 is formed by, for example, n-type amorphous silicon, n-type amorphous silicon germanium, n-type amorphous germanium, n-type amorphous silicon carbide, n-type amorphous silicon nitride, n-type amorphous silicon oxide, n-type amorphous silicon oxynitride, n-type amorphous silicon carbon oxide, or the like. The n-type amorphous semiconductor layer 4 contains phosphorus (P) as an n-type dopant and has a film thickness of, for example, 3 to 50 nm.

The p-type amorphous semiconductor layer 105 has a p-type conductivity and is an amorphous semiconductor layer containing hydrogen. The p-type amorphous semiconductor layer 105 is formed by, for example, p-type amorphous silicon, p-type amorphous silicon germanium, p-type amorphous germanium, p-type amorphous silicon carbide, p-type amorphous silicon nitride, p-type amorphous silicon oxide, p-type amorphous silicon oxynitride, p-type amorphous silicon carbon oxide, or the like. The p-type amorphous semiconductor layer 5 contains boron (B) as a p-type dopant and has a film thickness of, for example, 5 to 50 nm.

Application Example 1

In the present application example, a method for manufacturing the photoelectric conversion element 100 by using the film-forming method of the first embodiment will be described. FIGS. 8A to 8H are schematic cross-sectional views illustrating steps of manufacturing the photoelectric conversion element 100 illustrated in FIG. 7.

Figure 8A:
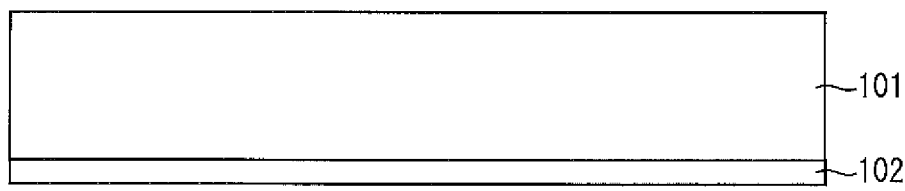
FIG. 8A illustrates a state where an antireflection film is formed on a light-receiving surface of a semiconductor substrate in the application example 1.
Figure 8B:
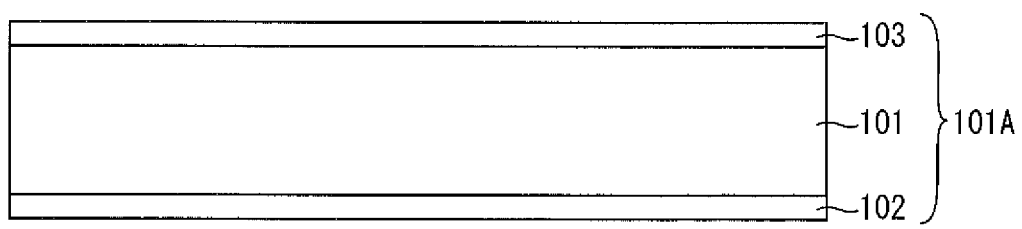
FIG. 8B illustrates a state where a passivation film is formed on a back surface of the semiconductor substrate illustrated in FIG. 8A.

First, in the present application example, the antireflection film 102 formed by, for example, an oxide film and a silicon nitride film is formed on the light-receiving surface of the semiconductor substrate 101 as illustrated in FIG. 8A, and the passivation film 103 formed by i-type amorphous silicon is formed on the back surface of the semiconductor substrate 101 as illustrated in FIG. 8B. Hereinafter, the semiconductor substrate 101 on which the passivation film 103 and the antireflection film 102 are formed is referred to as a semiconductor substrate 101A.

Figure 8C:
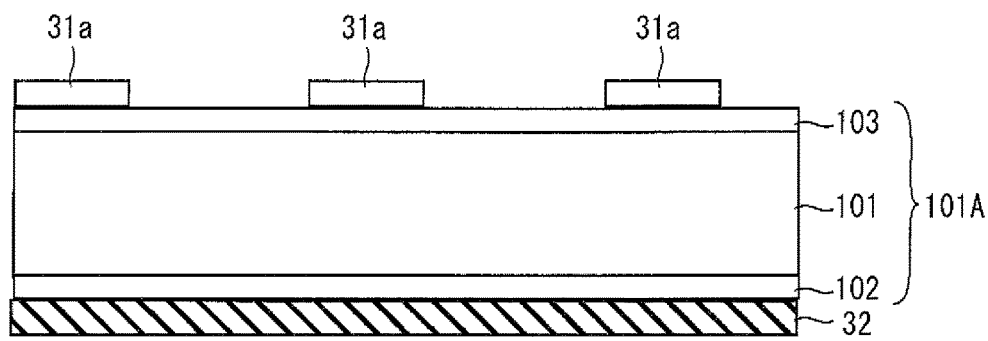
FIG. 8C illustrates a state where a metal mask for forming an n-type amorphous semiconductor layer is placed on the back surface of the semiconductor substrate illustrated in FIG. 8B and a jig with a magnet is placed on the light-receiving surface of the semiconductor substrate.

Then, the jig with the magnet 32, the semiconductor substrate 101A, and a metal mask 31a are stacked in this order at atmospheric pressure (step A of FIG. 2). Specifically, as illustrated in FIG. 8C, the metal mask 31a is placed on the semiconductor substrate 101A to contact the back surface side of the semiconductor substrate 101A, that is, the surface on which the passivation film 103 is formed. Further, the jig with the magnet 32 is arranged on the semiconductor substrate 101A in a stacked manner to contact the light-receiving surface side of the semiconductor substrate 101A, that is, the surface on which the antireflection film 102 is formed.

The metal mask 31a, the semiconductor substrate 101A, and the jig with the magnet 32 are conveyed in the stacked state to the vacuum chamber 10 (refer to FIG. 1) and the vacuum chamber 10 is exhausted until reaching the predetermined degree of vacuum (step B of FIG. 2). Thereby, air in each contact surface of the metal mask 31a, the semiconductor substrate 101A, and the jig with the magnet 32 is exhausted. By a magnetic force between the metal mask 31a and the jig with the magnet 32, an external force in a magnetic force direction is applied to each contact surface of the metal mask 31a, the semiconductor substrate 101A, and the jig with the magnet 32. As a result, the contact surfaces of the metal mask 31a and the semiconductor substrate 101A are in close contact with each other.

Figure 8D:
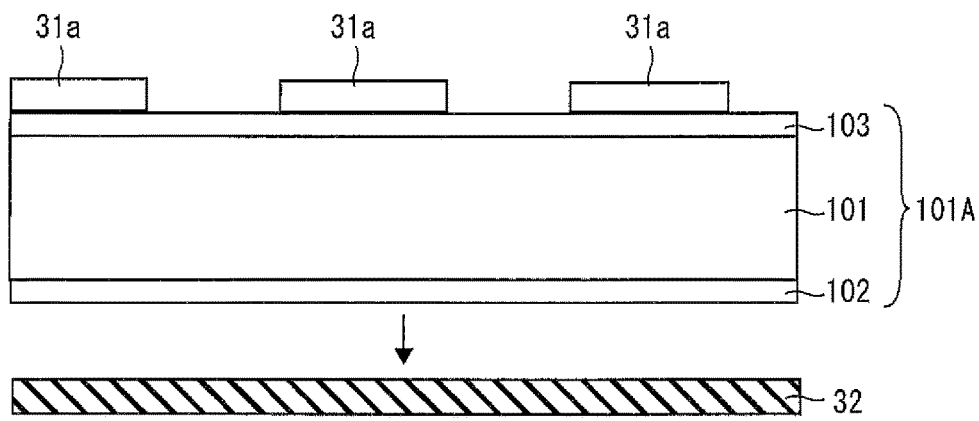
FIG. 8D illustrates a state where the jig with the magnet illustrated in FIG. 8C is separated from the semiconductor substrate.

The vacuum chamber 10 (refer to FIG. 1) is opened to the air, and the metal mask 31a, the semiconductor substrate 101A, and the jig with the magnet 32 are taken out. Then, as illustrated in FIG. 8D, the jig with the magnet 32 is separated from the semiconductor substrate 101A (refer to the step C of FIG. 2). Thereby, while the external force by the magnetic force between the metal mask 31a and the jig with the magnet 32 is removed at atmospheric pressure, the metal mask 31a and the semiconductor substrate 101A keep in close contact with each other.

Figure 9:
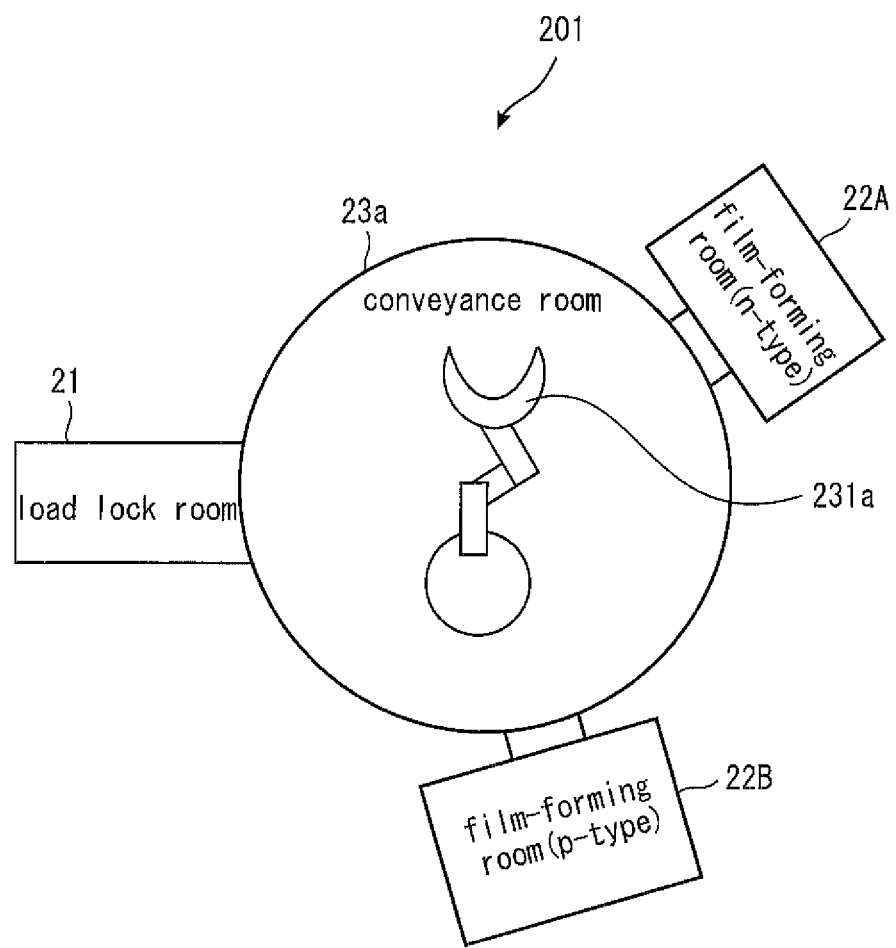
FIG. 9 is a schematic view illustrating a schematic configuration of a load lock chamber in the application example 1.

Then, the metal mask 31a and the semiconductor substrate 101A are conveyed in the stacked state to a load lock chamber 1. FIG. 9 is a schematic view illustrating a configuration example of a load lock chamber in the present application example. As illustrated in FIG. 9, a load lock chamber 201 includes a load lock room 21, film-forming rooms 22A and 22B, and a conveyance room 23a.

The conveyance room 23a has a hollow cylindrical shape. A conveyance robot 231a is provided inside the conveyance room 23a. The load lock room 21 and the film-forming rooms 22A and 22B are arranged radially around the conveyance room 23a. Each of the load lock room 21 and the film-forming rooms 22A and 22B is connected to the conveyance room 23a and is separated from the conveyance room 23a by the gate valve. Each of the load lock room 21, the conveyance room 23a, and the film-forming rooms 22A and 22B is exhausted by an exhaust device (not illustrated) until reaching the predetermined degree of vacuum.

In the present application example, the film-forming rooms 22A and 22B are plasma CVD devices each having an electrode structure of a parallel plate type. The film-forming room 22A is used to form a film of n-type amorphous silicon. The film-forming room 22B is used to form a film of p-type amorphous silicon.

The metal mask 31a and the semiconductor substrate 101A that are conveyed to the load lock chamber 201 are placed in the load lock room 21 and the load lock room 21 is exhausted until reaching the predetermined degree of vacuum (step D of FIG. 2).

After that, the gate valve of the load lock room 21 and the film-forming room 22A is opened, the metal mask 31a and the semiconductor substrate 101A are conveyed from the load lock room 21 to the film-forming room 22A by the conveyance robot 231a, and the gate valve is closed.

Then, in the film-forming room 22A, the n-type amorphous semiconductor layer 104 is formed on the back surface of the semiconductor substrate 101A (step E of FIG. 2). Specifically, in the film-forming room 22A, for example, a temperature of the semiconductor substrate 101A is set at 130 to 180° C., 0 to 100 sccm of hydrogen ($H_2$) gas, 40 sccm, of $SiH_4$ gas, and 40 sccm of phosphine ($PH_3$) gas are encapsulated, and a pressure of the film-forming room 22 is set to 40 to 120 Pa. Thereafter, for example, high-frequency power (13.56 MHz) whose RF power density is 5 to 15 mW/cm$^2$ is applied to a parallel plate electrode. Note that, the $PH_3$ gas is diluted by hydrogen and a concentration of the $PH_3$ gas is, for example, 1%.

Figure 8E:
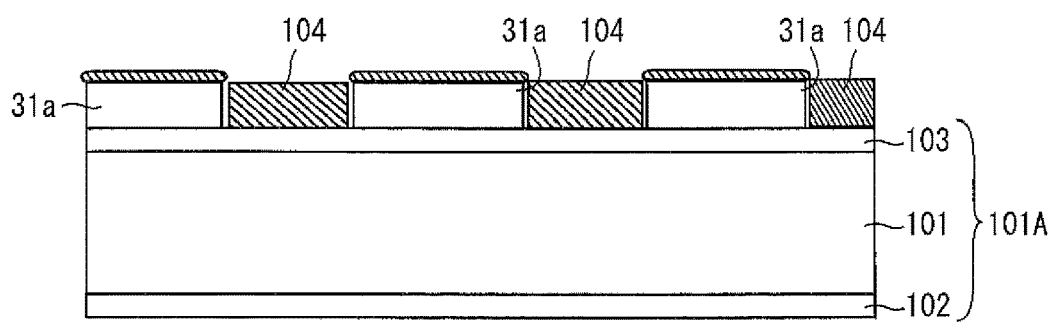
FIG. 8E illustrates a state where the n-type amorphous semiconductor layer is formed on the back surface of the semiconductor substrate illustrated in FIG. 8D.

Thereby, as illustrated in FIG. 8E, the n-type amorphous silicon is deposited in a region of the passivation film 103, which is not covered with the metal mask 31a, and the n-type amorphous semiconductor layer 104 is formed on the passivation film 103.

Figure 8F:
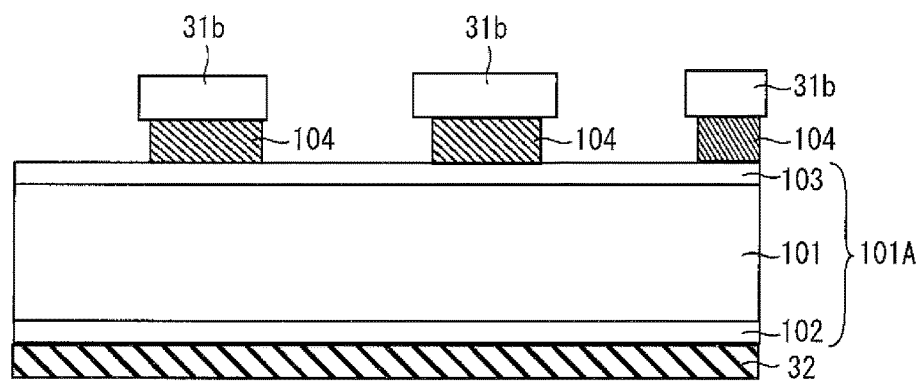
FIG. 8F illustrates a state where a metal mask for forming a p-type amorphous semiconductor layer is placed on the back surface of the semiconductor substrate illustrated in FIG. 8E and the jig with the magnet is placed on the light-receiving surface of the semiconductor substrate.

After the n-type amorphous semiconductor layer 104 is formed on the semiconductor substrate 101A, the metal mask 31a and the semiconductor substrate 101A on which the n-type amorphous semiconductor layer 104 is formed are taken out from the film-forming room 22A. Then, as illustrated in FIG. 8F, instead of the metal mask 31a, a metal mask 31b is placed on the n-type amorphous semiconductor layer 104 and the jig with the magnet 32 is placed on the light-receiving surface side of the semiconductor substrate 101A in the atmosphere (step A of FIG. 2). At this time, hydrofluoric acid treatment is performed to prevent the surface of the semiconductor substrate 101A from oxidizing. The metal mask 31b is the same as the metal mask 31a in a material, a thickness, and an open width.

The metal mask 31b, the semiconductor substrate 101A on which the n-type amorphous semiconductor layer 104 is formed, and the jig with the magnet 32 are conveyed in the stacked state to the vacuum chamber 10 (refer to FIG. 1), and the vacuum chamber 10 (refer to FIG. 1) is exhausted until reaching the predetermined degree of vacuum (step B of FIG. 2). Thereby, an external force by a magnetic force between the metal mask 31b and the jig with the magnet 32 is applied in a vacuum and the metal mask 31b and the semiconductor substrate 101A are in close contact with each other.

Figure 8G:
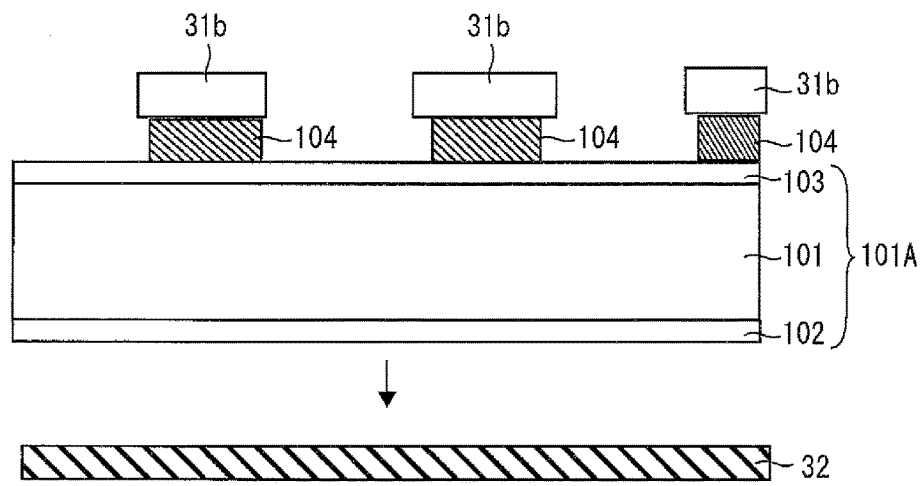
FIG. 8G illustrates a state where the jig with the magnet illustrated in FIG. 8F is separated from the semiconductor substrate.

After that, the vacuum chamber 10 is opened to the air, and the metal mask 31b, the semiconductor substrate 101A on which the n-type amorphous semiconductor layer 104 is formed, and the jig with the magnet 32 are taken out. Then, as illustrated in FIG. 8G, the jig with the magnet 32 is separated from the semiconductor substrate 101A on which the n-type amorphous semiconductor layer 104 is formed (step C of FIG. 2). Thereby, while the external force by the magnetic force is removed at atmospheric pressure, the metal mask 31b and the semiconductor substrate 101A keep in close contact with each other.

Then, the metal mask 31b and the semiconductor substrate 101A on which the n-type amorphous semiconductor layer 104 is formed are conveyed in the stacked state to the load lock chamber 201 (refer to FIG. 9). Then, the metal mask 31b and the semiconductor substrate 101A on which the n-type amorphous semiconductor layer 104 is formed are placed in the load lock room 21 and the load lock room 21 is exhausted until reaching the predetermined degree of vacuum (step D of FIG. 2).

After that, the gate valve of the load lock room 21 and the film-forming room 22B is opened, the metal mask 31b and the semiconductor substrate 101A on which the n-type amorphous semiconductor layer 104 is formed are conveyed from the load lock room 21 to the film-forming room 22B by the conveyance robot (not illustrated), and the gate valve is closed.

Then, in the film-forming room 22B, the p-type amorphous semiconductor layer 105 is formed on the back surface of the semiconductor substrate 101A (step E of FIG. 2). Specifically, in the film-forming room 22B, for example, a temperature of the semiconductor substrate 101A is set at 130 to 180° C., 0 to 100 sccm of $H_2$ gas, 40 sccm of $SiH_4$ gas, and 40 sccm of diborane ($B_2H_6$) gas are flowed, and a pressure of the film-forming room 22 is set to 40 to 200 Pa. Thereafter, high-frequency power (13.56 MHz) whose RF power density is 5 to 15 mW/cm$^2$ is applied to a parallel plate electrode. Note that, the $B_2H_6$ gas is diluted by hydrogen and a concentration of the $B_2H_6$ gas is, for example, 2%.

Figure 8H:
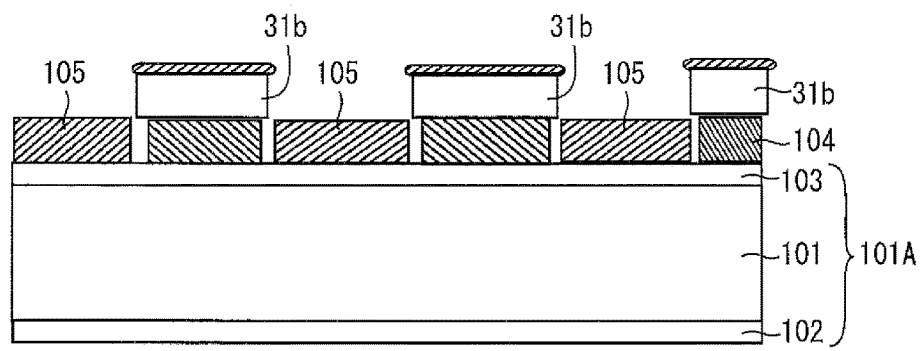
FIG. 8H illustrates a state where the p-type amorphous semiconductor layer is formed on the back surface of the semiconductor substrate illustrated in FIG. 8F.

Thereby, as illustrated in FIG. 8H, the p-type amorphous silicon is deposited in a region of the passivation film 103, which is not covered with the metal mask 31b, and the p-type amorphous semiconductor layer 105 is formed on the passivation film 103. After the p-type amorphous semiconductor layer 105 is formed, the metal mask 31b and the semiconductor substrate 101A on which the n-type amorphous semiconductor layer 104 and the p-type amorphous semiconductor layer 105 are formed are taken out from the film-forming room 22B.

Figure 7:
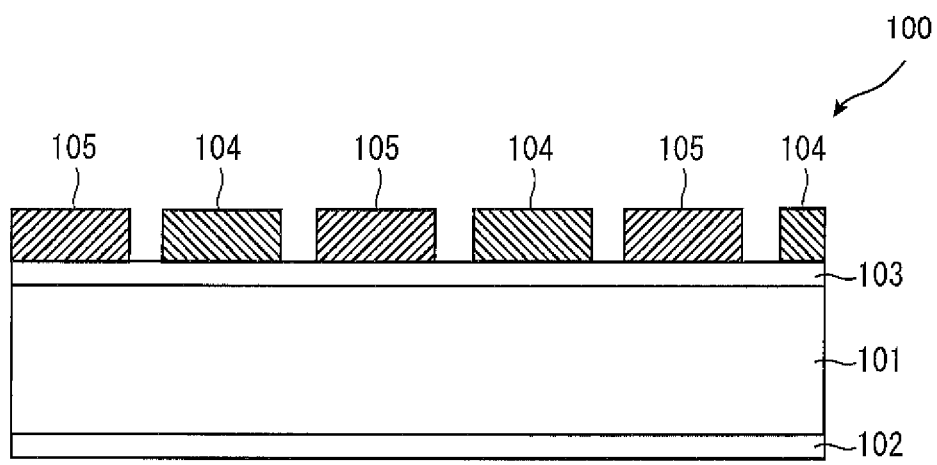
FIG. 7 is a cross-sectional view illustrating a schematic configuration of a photoelectric conversion element in application examples 1 to 4.

In this manner, the n-type amorphous semiconductor layer 104 and the p-type amorphous semiconductor layer 105 are formed in order on the semiconductor substrate 101A, so that the photoelectric conversion element 100 illustrated in FIG. 7 is formed.

Application Example 2

In the present application example, a method for manufacturing the photoelectric conversion element 100 by using the film-forming method of the second embodiment will be described. FIGS. 10A to 10F are schematic cross-sectional views illustrating steps of manufacturing the photoelectric conversion element 100 in the present application example.

Figure 10A:
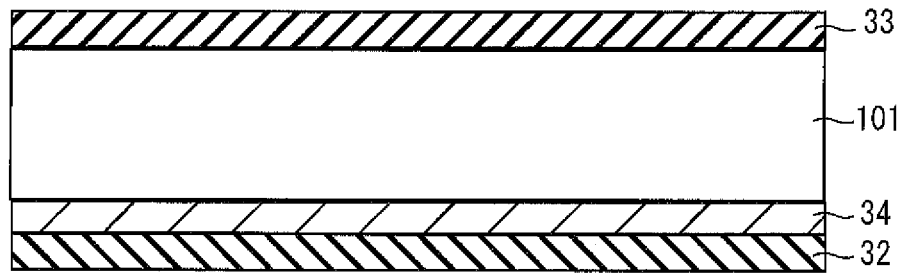
FIG. 10A illustrates a state where a magnetic member is placed on the back surface of the semiconductor substrate and a non-magnetic member and the jig with the magnet are placed in order on the light-receiving surface of the semiconductor substrate in the application example 2.

First, the light-receiving surface of the semiconductor substrate 101 is thermally oxidized to form an oxide film. Then, as illustrated in FIG. 10A, the non-magnetic jig 34 constituted by a glass plate or the like comes in contact with the light receiving surface side of the semiconductor substrate 101 and the jig with the magnet 32 comes in contact with the non-magnetic jig 34, and further, the magnetic member 33 comes in contact with the back surface of the semiconductor substrate 101 so that they are stacked. The magnetic member 33 has a thickness of, for example, 80 μm to 300 μm. The non-magnetic jig 34 has a thickness of, for example, 0.5 mm to 10 mm.

Then, the magnetic member 33, the semiconductor substrate 101, the non-magnetic jig 34, and the jig with the magnet 32 are conveyed in the stacked state to the vacuum chamber 10 and the vacuum chamber 10 is exhausted until reaching the predetermined degree of vacuum (step B1 of FIG. 3). Thereby, air in each contact surface of the magnetic member 33, the semiconductor substrate 101, the non-magnetic jig 34, and the jig with the magnet 32 is exhausted. Further, by a magnetic force between the magnetic member 33 and the jig with the magnet 32, an external force in a magnetic force direction is applied to each contact surface of the magnetic member 33, the semiconductor substrate 101, the non-magnetic jig 34, and the jig with the magnet 32. As a result, the contact surfaces of the magnetic member 33, the semiconductor substrate 101, the non-magnetic jig 34, and the jig with the magnet 32 are in close contact with each other.

Figure 10B:
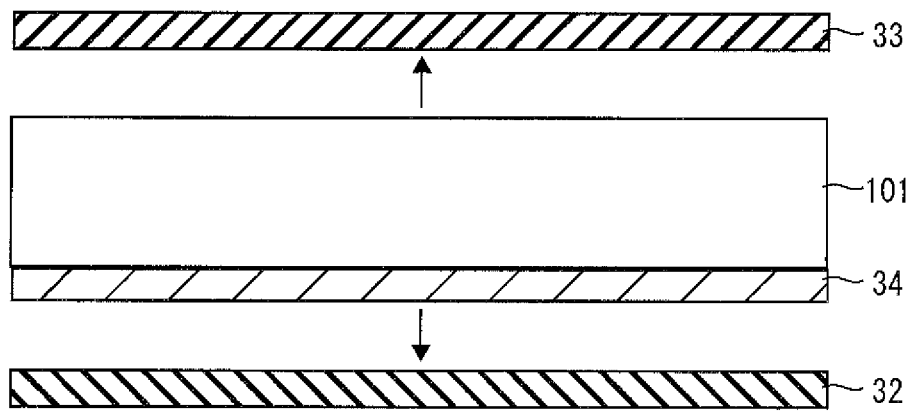
FIG. 10B illustrates a state where the magnetic member and the jig with the magnet that are illustrated in FIG. 10A are separated from the semiconductor substrate.

After that, the vacuum chamber 10 is opened to the air, and the magnetic member 33, the semiconductor substrate 101, the non-magnetic jig 34, and the jig with the magnet 32 are taken out. Then, as illustrated in FIG. 10B, the magnetic member 33 is separated from the semiconductor substrate 101 and the jig with the magnet 32 is separated from the non-magnetic member 34 (step C1 of FIG. 3). Thereby, while the external force by the magnetic force is removed at atmospheric pressure, the semiconductor substrate 101 and the non-magnetic jig 34 keep in close contact with each other.

Figure 11:
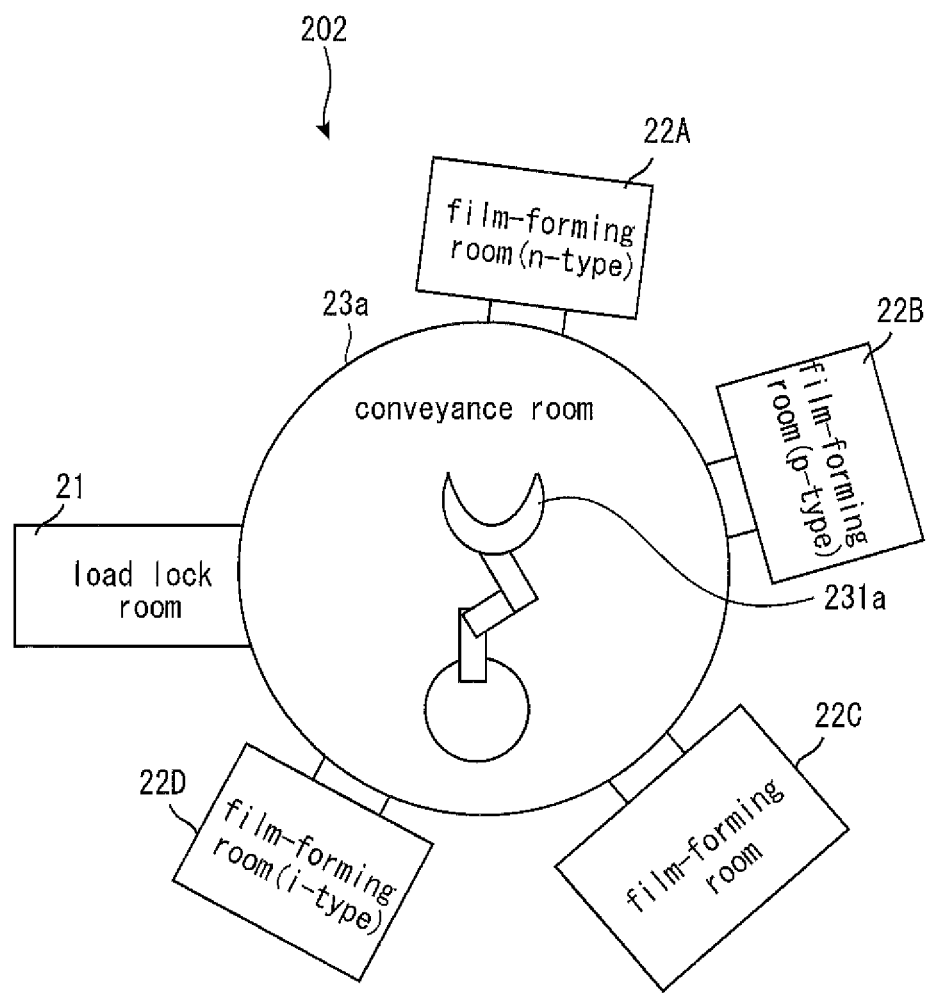
FIG. 11 is a schematic view illustrating a configuration example of a load lock chamber in the application example 2.

Then, the semiconductor substrate 101 and the non-magnetic jig 34 are conveyed in the stacked state to a load lock chamber. FIG. 11 is a schematic view illustrating a configuration example of the load lock chamber in the present application example. The load lock chamber 202 includes film-forming rooms 22C and 22D in addition to the load lock room 21, the film-forming rooms 22A and 22B, and the conveyance room 23a similar to those of the load lock chamber 201 described above.

Each of the film-forming rooms 22C and 22D is connected to the conveyance room 23a, and the film-forming rooms 22C and 22D are separated from the conveyance room 23a by the gate valve.

The film-forming room 22C is used to form a silicon nitride film, for example, by a sputtering method. The film-forming room 22D is used to form a film of i-type amorphous silicon, for example, by a plasma CVD method.

The semiconductor substrate 101 and the non-magnetic jig 34 that are conveyed to the load lock chamber 202 are placed in the load lock room 21 and the load lock room 21 is exhausted until reaching the predetermined degree of vacuum (step D1 of FIG. 3).

After that, the gate valve of the load lock room 21 and the film-forming room 22C is opened, the semiconductor substrate 101 and the non-magnetic jig 34 are conveyed from the load lock room 21 to the film-forming room 22C by the conveyance robot 231a, and the gate valve is closed.

Figure 10C:
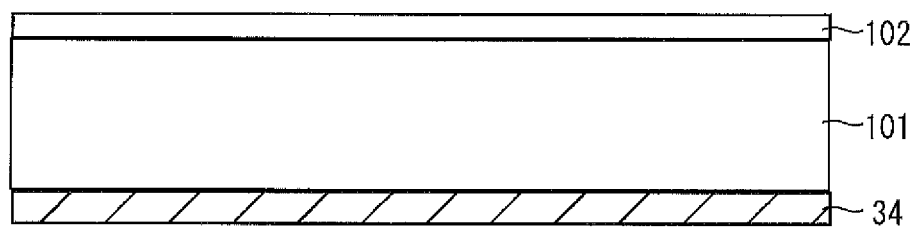
FIG. 10C illustrates a state where the antireflection film is formed on the light-receiving surface of the semiconductor substrate illustrated in FIG. 10B.

Then, in the film-forming room 22C, by a sputtering method, a silicon nitride film is formed in contact with the oxide film formed on the light-receiving surface of the semiconductor substrate 101 (step E1 of FIG. 3). Thereby, the antireflection film 102 is formed on the light-receiving surface of the semiconductor substrate 1 as illustrated in FIG. 10C. In this manner, since the antireflection film 102 formed by the silicon nitride film is formed on the light-receiving surface of the semiconductor substrate 101 while the non-magnetic jig 34 is in close contact with the semiconductor substrate 101, the antireflection film 102 is prevented from being formed to extend onto the back surface side of the semiconductor substrate 101.

Figure 10D:
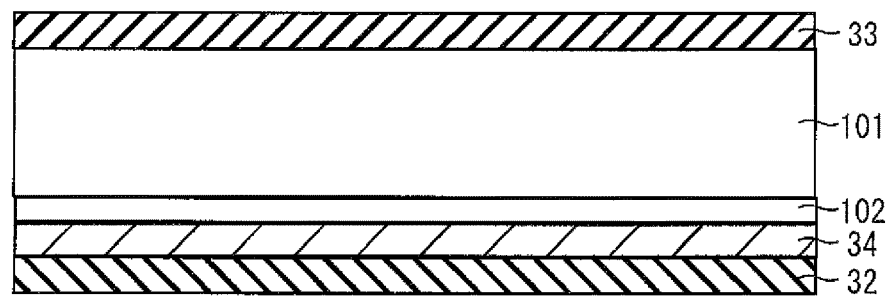
FIG. 10D illustrates a state where the magnetic member is placed on the back surface of the semiconductor substrate illustrated in FIG. 10C and the jig with the magnet is placed on a non-magnetic jig.

The semiconductor substrate 101 having the antireflection film 102 formed on the light-receiving surface and the non-magnetic jig 34 are taken out from the film-forming room 22C and the front and the back of the semiconductor substrate 101 are reversed. Further, as illustrated in FIG. 10D, the magnetic member 33 comes in contact with the back surface of the semiconductor substrate 101, the non-magnetic jig 34 comes in contact with the antireflection film 102, and the jig with the magnet 32 comes in contact with the non-magnetic jig 34 so that they are stacked (step A1 of FIG. 3).

Then, the magnetic member 33, the semiconductor substrate 101 on which the antireflection film 102 is formed, the non-magnetic jig 34, and the jig with the magnet 32 are conveyed in the stacked state to the vacuum chamber 10 and the vacuum chamber 10 is exhausted until reaching the predetermined degree of vacuum (step B1 of FIG. 3). Thereby, similarly to the case of forming the antireflection film 102 as described above, by an external force by a magnetic force between the magnetic member 33 and the jig with the magnet 32, the contact surfaces of the magnetic member 33, the semiconductor substrate 101 on which the antireflection film 102 is formed, and the non-magnetic jig 34 are in close contact with each other in a vacuum.

Figure 10E:
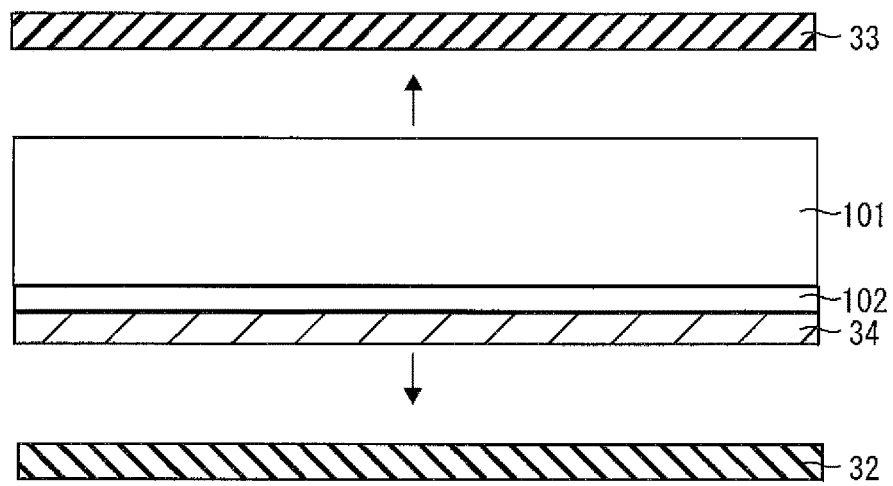
FIG. 10E illustrates a state where the magnetic member and the jig with the magnet that are illustrated in FIG. 10D are separated from the semiconductor substrate.

Then, the vacuum chamber 10 is opened to the air, and the magnetic member 33, the semiconductor substrate 101, the non-magnetic jig 34, and the jig with the magnet 32 are taken out. Further, as illustrated in FIG. 10E, the magnetic member 33 is separated from the semiconductor substrate 101 and the jig with the magnet 32 is separated from the non-magnetic member 34 (step C1 of FIG. 3). Thereby, while the external force by the magnetic force is removed at atmospheric pressure, the substrate 101A and the non-magnetic jig 34 keep in close contact with each other.

Subsequently, the semiconductor substrate 101 and the non-magnetic jig 34 are conveyed in the stacked state to the load lock chamber 202, the semiconductor substrate 101 and the non-magnetic jig 34 are placed in the load lock room 21, and the load lock room 21 is brought into a vacuum state (step D1 of FIG. 3). After that, the gate valve of the load lock room 21 and the film-forming room 22D is opened, the semiconductor substrate 101 and the non-magnetic jig 34 are conveyed from the load lock room 21 to the film-forming room 22D by the conveyance robot 231a, and the gate valve is closed.

Figure 10F:
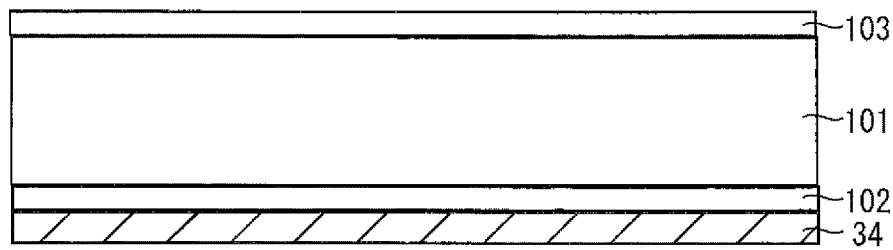
FIG. 10F illustrates a state where the passivation film is formed on the back surface of the semiconductor substrate illustrated in FIG. 10E.

Then, in the film-forming room 22D, the passivation film 103 is formed on the back surface of the semiconductor substrate 101 (step E1 of FIG. 3). Specifically, in the film-forming room 22D, for example, a temperature of the semiconductor substrate 101 is set at 130 to 180° C., 0 to 100 sccm of $H_2$ gas and 40 sccm of $SiH_4$ gas are flowed, and a pressure of the film-forming room 22D is set to 40 to 120 Pa. Thereafter, high-frequency power (13.56 MHz) whose RF power density is 5 to 15 mW/cm$^2$ is applied to a parallel plate electrode. Thereby, as illustrated in FIG. 10F, the passivation film 103 formed by i-type amorphous silicon is formed on the back surface of the semiconductor substrate 1.

The semiconductor substrate 101 on which the passivation film 103 and the antireflection film 102 are formed and the non-magnetic jig 34 are taken out from the film-forming room 22D and the steps similar to those of FIGS. 8C to 8H of the application example 1 described above are carried out, so that the photoelectric conversion element 100 illustrated in FIG. 7 is formed.

Application Example 3

In the present application example, a method for manufacturing the photoelectric conversion element 100 by using the film-forming method of the third embodiment will be described. FIGS. 12A to 12F are schematic cross-sectional views illustrating steps of manufacturing the photoelectric conversion element 100 in the present application example.

Figure 12A:
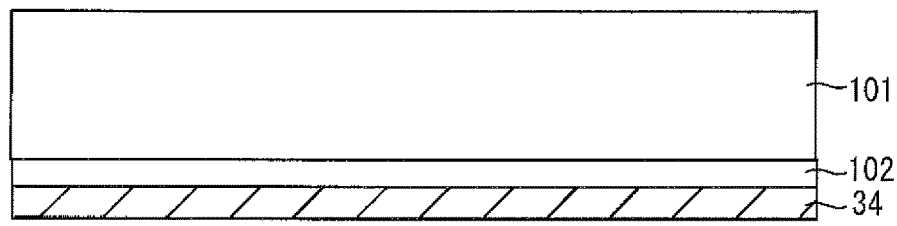
FIG. 12A illustrates a state where the antireflection film is formed on the light-receiving surface of the semiconductor substrate and the non-magnetic jig is placed on the light-receiving surface of the semiconductor substrate in the application example 3.

First, similarly to the step illustrated in FIG. 8A of the application example 1, the antireflection film 102 constituted by, for example, an oxide film and a silicon nitride film is formed on the light-receiving surface of the semiconductor substrate 101 as illustrated in FIG. 12A. After that, the non-magnetic jig 34 comes into contact with the light-receiving surface of the semiconductor substrate 101, that is, the antireflection film 102 so that they are stacked. Then, the semiconductor substrate 101 and the non-magnetic jig 34 are conveyed in the stacked state to a load lock chamber.

Figure 13:
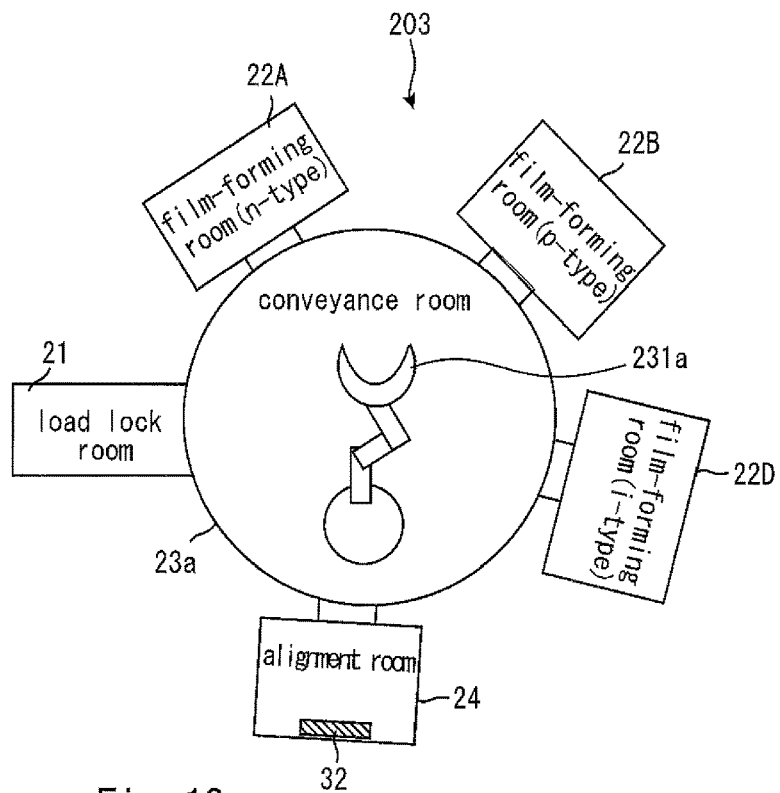
FIG. 13 is a schematic view illustrating a configuration example of a load lock chamber in the application example 3.

FIG. 13 is a schematic view illustrating a configuration example of the load lock chamber in the present application example. A load lock chamber 203 includes an alignment room 24 in addition to the load lock room 21, the film-forming rooms 22A, 22B and 22D, and the conveyance room 23a similar to those of the application example 1. The alignment room 24 is connected to the conveyance room 23a and is separated from the conveyance room 23a by the gate valve. The alignment room 24 includes metal masks for forming the n-type amorphous semiconductor layer 104 and the p-type amorphous semiconductor layer 105 on the semiconductor substrate 101 and switches the metal masks on the semiconductor substrate 101.

The semiconductor substrate 101 and the non-magnetic jig 34 that are conveyed to the load lock chamber 203 are placed, in the load lock room 21 and the load lock room 21 is exhausted until reaching the predetermined degree of vacuum.

After that, the gate valve of the load lock room 21 arid the film-forming room 22D is opened, the semiconductor substrate 101 and the non-magnetic jig 34 are conveyed from the load lock room 21 to the film-forming room 22D by the conveyance robot 231a, and the gate valve is closed.

Then, in the film-forming room 22D, the passivation film 103 formed by i-type amorphous silicon is formed on the back surface of the semiconductor substrate 101, for example, under film-forming conditions similar to those of the application example 2 described above (refer to FIG. 12B).

After the passivation film 103 is formed, the semiconductor substrate 101 on which the passivation film 103 is formed and the non-magnetic jig 34 in the stacked state are taken out from the film-forming room 22D. Then, as illustrated in FIG. 12C, the jig with the magnet 32 is placed on the non-magnetic jig 34 to contact with each other, and the metal mask 31a for forming the n-type amorphous semiconductor layer 104 is placed on the back surface of the semiconductor substrate 101 (step A2 of FIG. 4). Thereby, an external force by a magnetic force between the metal mask 31a and the jig with the magnet 32 is applied to each contact surface of the metal mask 31a, the semiconductor substrate 101, the non-magnetic jig 34, and the jig with the magnet 32.

Then, the metal mask 31a, the semiconductor substrate 101, the non-magnetic jig 34, and the jig with the magnet 32 are conveyed in the stacked state to the load lock room 21 and the load lock room 21 is exhausted until reaching the predetermined degree of vacuum (step B2 of FIG. 4). Thereby, air between each contact surfaces of the semiconductor substrate 101, the non-magnetic jig 34, and the jig with the magnet 32 is exhausted, and the respective contact surfaces are in close contact with each other.

After that, the gate valve of the load lock room 21 and the film-forming room 22A is opened, the metal mask 31a, the semiconductor substrate 101, and the non-magnetic jig 34 are conveyed in the stacked state to the film-forming room 22A by the conveyance robot 231a, and the gate valve is closed (step C2 of FIG. 4). Thereby, the jig with the magnet 32 is left in the load lock room 21. While the external force by the magnetic force between the metal mask 31a and the jig with the magnet 32 is removed, the metal mask 31a, the semiconductor substrate 101, and the non-magnetic jig 34 keep in close contact with each other.

Figure 12B:
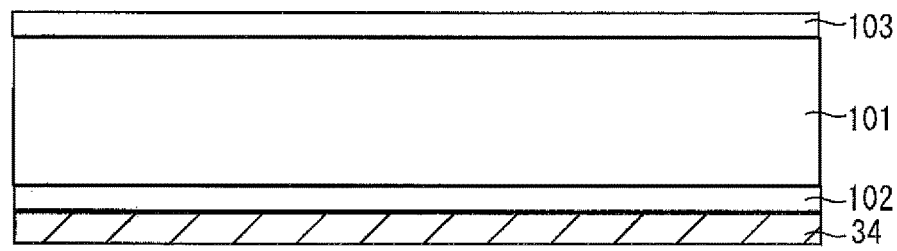
FIG. 12B illustrates a state where the passivation film is formed on the back surface of the semiconductor substrate illustrated in FIG. 12A.
Figure 12C:
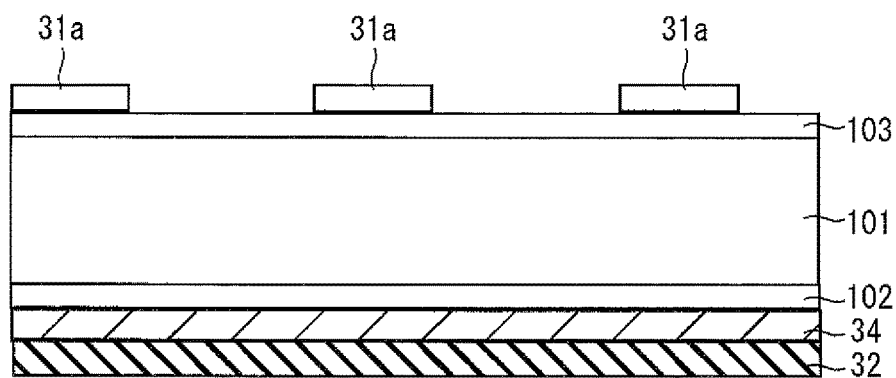
FIG. 12C illustrates a state where the metal mask for forming the n-type amorphous semiconductor layer is placed on the back surface of the semiconductor substrate illustrated in FIG. 12B and the jig with the magnet is placed on the light-receiving surface of the semiconductor substrate.
Figure 12D:
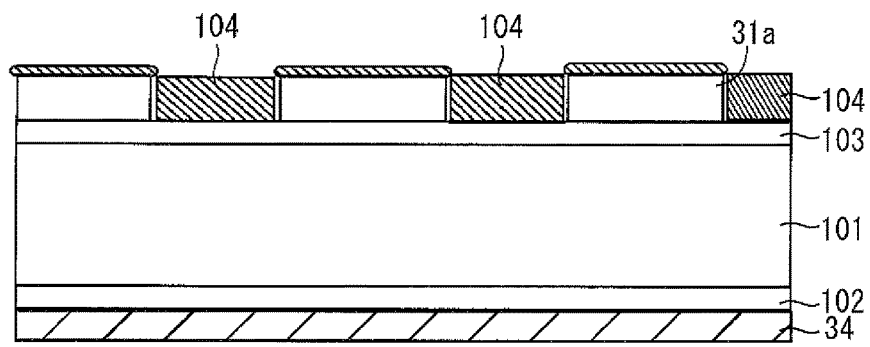
FIG. 12D illustrates a state where the jig with the magnet illustrated in FIG. 12C is separated from the semiconductor substrate and the n-type amorphous semiconductor layer is formed on the back surface of the semiconductor substrate.

In the film-forming room 22A, under film-forming conditions similar to those of the application example 1 described above, the n-type amorphous silicon is deposited in a region of the passivation film 103, which is not covered with the metal mask 31a, and the n-type amorphous semiconductor layer 104 is formed on the passivation film 103 as illustrated in FIG. 12D (step C2 of FIG. 4).

After the n-type amorphous semiconductor layer 104 is formed, the gate valve of the film-forming room 22A and the load lock room 21 is opened, the metal mask 31a, the semiconductor substrate 101 on which the n-type amorphous semiconductor layer 104 is formed, and the non-magnetic jig 34 are conveyed in the stacked state from the film-forming room 22A to the load lock room 21 by the conveyance robot 231a, and the gate valve is closed.

Then, the metal mask 31a, the semiconductor substrate 101, and the non-magnetic jig 34 are arranged in a stacked manner so that the non-magnetic jig 34 contacts the jig with the magnet 32 that is left in the load lock room 21, and the load lock room 21 is exhausted until reaching the predetermined degree of vacuum (step B2 of FIG. 4).

Figure 12E:
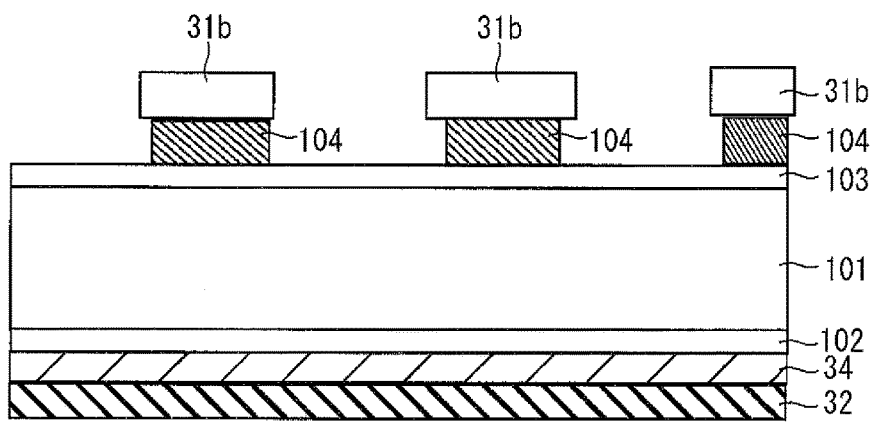
FIG. 12E illustrates a state where the metal mask for forming the p-type amorphous semiconductor layer is placed on the back surface of the semiconductor substrate illustrated in FIG. 12D and the jig with the magnet is placed on the light-receiving surface of the semiconductor substrate.

After that, the gate valve of the load lock room 21 and the alignment room 24 is opened and the metal mask 31a, the semiconductor substrate 101, and the non-magnetic jig 34 are conveyed in the stacked state to the alignment room 24 by the conveyance robot 231a. Then, as illustrated in FIG. 12E, instead of the metal mask 31a, the metal mask 31b for forming the p-type amorphous semiconductor layer 105 is arranged on the back surface of the semiconductor substrate 101, that is, on the passivation film 103 and the n-type amorphous semiconductor layer 104 of the semiconductor substrate 101.

After that, the gate valve of the alignment room 24 and the film-forming room 22B is opened and the metal mask 31b, the semiconductor substrate 101, and the non-magnetic jig 34 are conveyed in the stacked state from the alignment room 24 to the film-forming room 22A by the conveyance robot 231a, and the gate valve is closed.

Figure 12F:
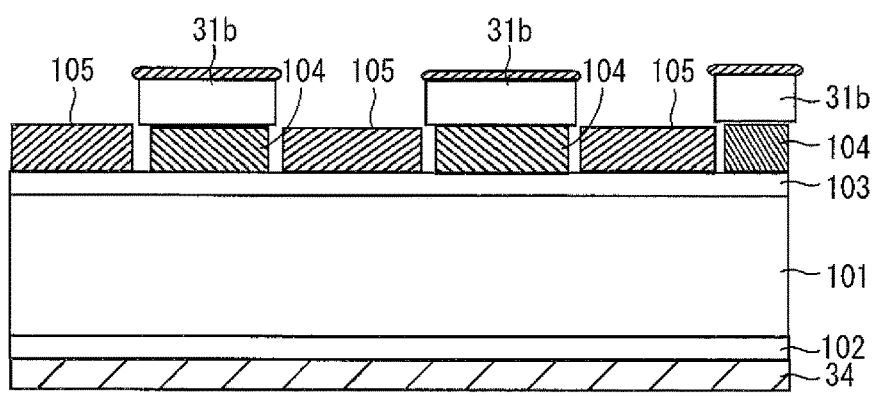
FIG. 12F illustrates a state where the jig with the magnet illustrated in FIG. 12E is separated from the semiconductor substrate and the p-type amorphous semiconductor layer is formed on the back surface of the semiconductor substrate.

In the film-forming room 22B, under film-forming conditions similar to those of the application example 1 described above, the p-type amorphous silicon is deposited in a region of the passivation film 103, which is not covered with the metal mask 31b, and the p-type amorphous semiconductor layer 105 is formed on the passivation film 103 as illustrated in FIG. 12F (step C2 of FIG. 4).

After the p-type amorphous semiconductor layer 105 is formed, the gate valve of the film-forming room 22B and the alignment room 24 is opened, the metal mask 31b, the semiconductor substrate 101, and the non-magnetic jig 34 are conveyed in the stacked state from the film-forming room 22B to the alignment room 24 by the conveyance robot 231a, and the gate valve is closed. Then, the metal mask 31b is removed from the back surface of the semiconductor substrate 101 in the film-forming room 22B, so that the photoelectric conversion element 100 illustrated in FIG. 7 is formed.

Application Example 4

In the present application example, a method for manufacturing the photoelectric conversion element 100 by using the film-forming method of the fourth embodiment will be described. Manufacturing steps different from those of the application example 3 will be mainly described below.

First, similarly to the application example 3, the antireflection film 102 is formed on the light-receiving surface of the semiconductor substrate 101, and then, the semiconductor substrate 101 and the non-magnetic jig 34 are conveyed in the stacked state to a load lock chamber so that the non-magnetic jig 34 contacts the antireflection film 102 as illustrated in FIG. 12A.

Figure 14:
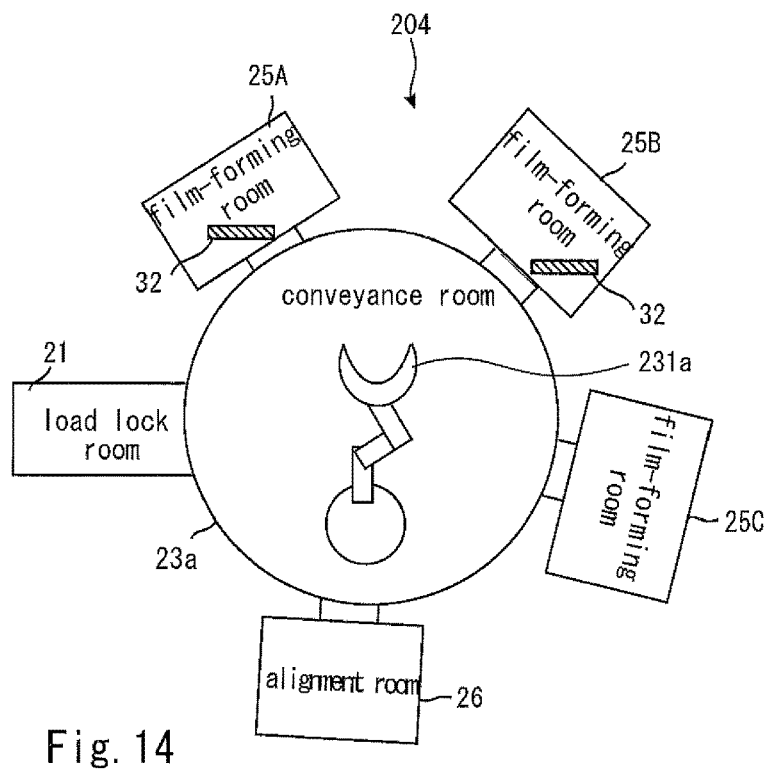
FIG. 14 is a schematic view illustrating a configuration example of a load lock chamber in the application example 4.

FIG. 14 is a schematic view illustrating a configuration example of the load lock chamber in the present application example. A load lock chamber 204 includes film-forming rooms 25A, 25B, and 25C and an alignment room 26 in addition to the load lock room 21 and the conveyance room 23a similar to those of the application example 3.

Each of the film-forming rooms 25A, 25B, and 25C and the alignment room 26 is connected to the conveyance room 23a and is separated from the conveyance room 23a by the gate valve. Each of the load lock room 21, the conveyance room 23a, the film-forming rooms 25A, 25B, and 25C, and the alignment room 26 is exhausted by an exhaust device (not illustrated) until reaching the predetermined degree of vacuum.

The film-forming room 25A is used to form a film of n-type amorphous silicon, for example, by a plasma CVD method. The film-forming room 25B is used to form a film of p-type amorphous silicon, for example, by a plasma CVD method. Each of the film-forming room 25A and the film-forming room 25B includes the jig with the magnet 32. In each of the film-forming room 25A and the film-forming room 25B, the jig with the magnet 32 is provided at a position where the semiconductor substrate 101 is arranged. The film-forming room 25C is used to form a film of i-type amorphous silicon, for example, by a plasma CVD method.

The alignment room 26 includes metal masks for forming the n-type amorphous semiconductor layer 104 and the p-type amorphous semiconductor layer 105 on the semiconductor substrate 101 and arranges a metal mask on the semiconductor substrate 101.

The semiconductor substrate 101 on which the antireflection film 102 is formed and the non-magnetic jig 34 that are conveyed to the load lock chamber 204 are placed in the load lock room 21 and the load lock room 21 is exhausted until reaching the predetermined degree of vacuum.

After that, the gate valve of the load lock room 21 and the film-forming room 25C is opened, the semiconductor substrate 101 on which the antireflection film 102 is formed and the non-magnetic jig 34 are conveyed from the load lock room 21 to the film-forming room 25C by the conveyance robot 231a, and the gate valve is closed.

Then, by forming a film of i-type amorphous silicon in the film-forming room 25C, for example, under film-forming conditions similar to those of the application example 3 described above, the passivation film 103 is formed on the back surface of the semiconductor substrate 101 as illustrated in FIG. 12B.

After the passivation film 103 is formed, the semiconductor substrate 101 on which the passivation film 103 is formed and the non-magnetic jig 34 in the stacked state are taken out from the film-forming room 25C, and the metal mask 31a for forming the n-type amorphous semiconductor layer 104 is placed on the back surface of the semiconductor substrate 101 (step A3 of FIG. 5, refer to FIG. 12C).

Then, the metal mask 31a, the semiconductor substrate 101, and the non-magnetic jig 34 are conveyed in the stacked state to the load lock room 21 and the load lock room 21 is exhausted until reaching the predetermined degree of vacuum (step B3 of FIG. 5).

After that, the gate valve of the load lock room 21 and the film-forming room 25A is opened, the metal mask 31a, the semiconductor substrate 101, and the non-magnetic jig 34 are conveyed in the stacked state to the film-forming room 25A by the conveyance robot 231a, and the gate valve is closed (step C3 of FIG. 5).

The metal mask 31a, the semiconductor substrate 101, and the non-magnetic jig 34 that are conveyed to the film-forming room 25A are arranged so that the non-magnetic jig 34 contacts the jig with the magnet 32 in the film-forming room 25A as illustrated in FIG. 12C. Thereby, an external force by a magnetic force between the metal mask 31a and the jig with the magnet 32 is applied in a vacuum to each contact surface of the metal mask 31a, the semiconductor substrate 101, the non-magnetic jig 34, and the jig with the magnet 32, and the contact surfaces of the metal mask 31a, the semiconductor substrate 101, the non-magnetic jig 34, and the jig with the magnet 32 are in close contact with each other.

Figure 15A:
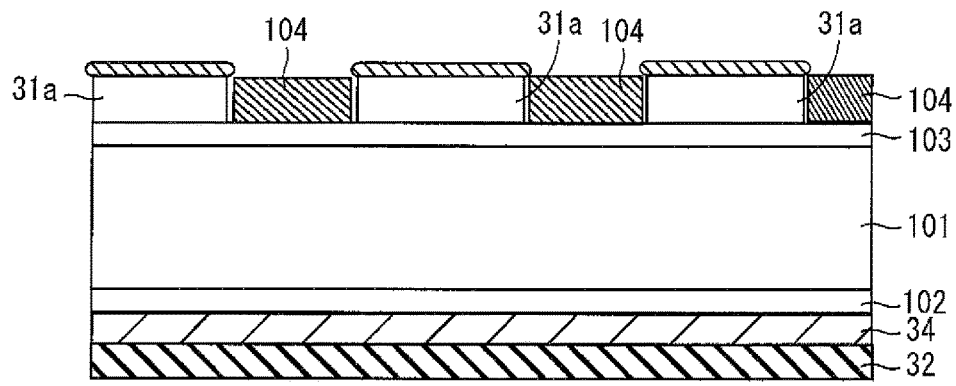
FIG. 15A illustrates a state where the n-type amorphous semiconductor layer is formed on the back surface of the semiconductor substrate illustrated in FIG. 12C in the application example 4.

Then, by forming a film of n-type amorphous silicon in the film-forming room 25A under film-forming conditions similar to those of the application example 3 described above, the n-type amorphous semiconductor layer 104 is formed in a region of the passivation film 103, which is not covered with the metal mask 31a, as illustrated in FIG. 15A.

After the n-type amorphous semiconductor layer 104 is formed, the gate valve of the film-forming room 25A and the alignment room 26 is opened, the metal mask 31a, the semiconductor substrate 101 on which the n-type amorphous semiconductor layer 104 is formed, and the non-magnetic jig 34 are conveyed in the stacked state from the film-forming room 25A to the alignment room 26 by the conveyance robot 231a, and the gate valve is closed.

Then, instead of the metal mask 31a, the metal mask 31b for forming the p-type amorphous semiconductor layer 105 is arranged on the back surface of the semiconductor substrate 101, that is, on the passivation film 103 and the n-type amorphous semiconductor layer 104 of the semiconductor substrate 101 in the alignment room 26. After that, the gate valve of the alignment room 26 and the film-forming room 25B is opened and the metal mask 31b, the semiconductor substrate 101, and the non-magnetic jig 34 are conveyed in the stacked state from the alignment room 26 to the film-forming room 25B by the conveyance robot 231a, and the gate valve is closed.

Then, the metal mask 31b, the semiconductor substrate 101, and the non-magnetic jig 34 that are conveyed to the film-forming room 25B are arranged so that the non-magnetic jig 34 contacts the jig with the magnet 32 in the film-forming room 25B as illustrated in FIG. 12E. Thereby, an external force by a magnetic force between the metal mask 31b and the jig with the magnet 32 is applied in a vacuum to each contact surface of the metal mask 31b, the semiconductor substrate 101, the non-magnetic jig 34, and the jig with the magnet 32. As a result, the contact surfaces of the metal mask 31b, the semiconductor substrate 101, the non-magnetic jig 34, and the jig with the magnet 32 are in close contact with each other.

Figure 15B:
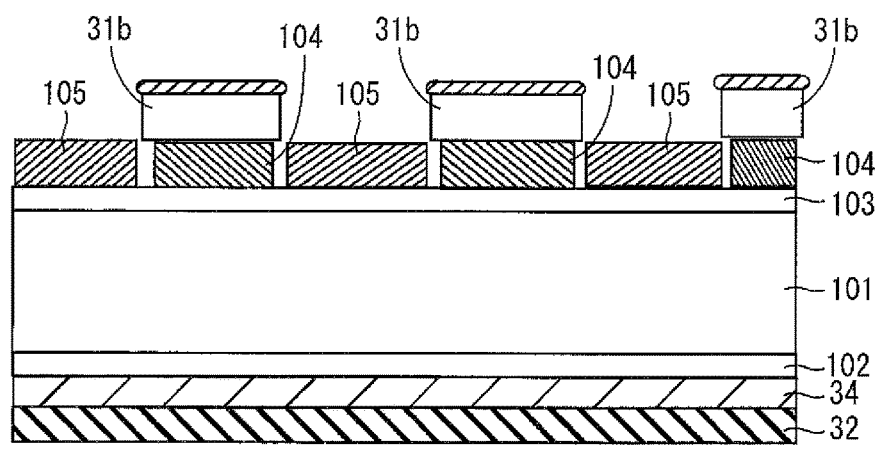
FIG. 15B illustrates a state where the p-type amorphous semiconductor layer is formed on the back surface of the semiconductor substrate illustrated in FIG. 12E in the application example 4.

Then, by forming a film of p-type amorphous silicon in the film-forming room 25B under film-forming conditions similar to those of the application example 3 described above, the p-type amorphous semiconductor layer 105 is formed in a region of the passivation film 103, which is not covered with the metal mask 31b, as illustrated in FIG. 15B.

After the p-type amorphous semiconductor layer 105 is formed, the gate valve of the film-forming room 25B and the alignment room 26 is opened, the metal mask 31b, the semiconductor substrate 101 on which the n-type amorphous semiconductor layer 104 and the p-type amorphous semiconductor layer 105 are formed, and the non-magnetic jig 34 are conveyed in the stacked state from the film-forming room 25B to the alignment room 26 by the conveyance robot 231a, and the gate valve is closed.

After the p-type amorphous semiconductor layer 105 is formed, similarly to the application example 3 described above, the metal mask 31b, the semiconductor substrate 101 on which the n-type amorphous semiconductor layer 104 is formed, and the non-magnetic jig 34 are conveyed in the stacked state from the film-forming room 25B to the alignment room 26, and the metal mask 31b is removed from the back surface of the semiconductor substrate 101, so that the photoelectric conversion element 100 illustrated in FIG. 7 is formed.

Modified Examples

As above, the embodiments of the invention have been described, but the aforementioned embodiments are merely examples for carrying out the invention. Thus, the invention is not limited to the aforementioned embodiments, and may be carried out by appropriately modifying the aforementioned embodiments within the scope of the spirit of the invention. Modified examples of the invention will be described below.

(1) Though an example in which the metal mask 31, the substrate 30, and the jig with the magnet 32 are taken out from the vacuum chamber 10 and the jig with the magnet 32 is separated from the substrate 30 in the atmosphere has been described in the first embodiment above, the jig with the magnet 32 may be separated in the vacuum chamber 10. That is, after the metal mask 31, the substrate 30, and the jig with the magnet 32 are arranged in the vacuum chamber 10 and the vacuum chamber 10 is brought into a vacuum state, the jig with the magnet 32 may be separated from the substrate 30 in the vacuum chamber 10.

Figure 16:
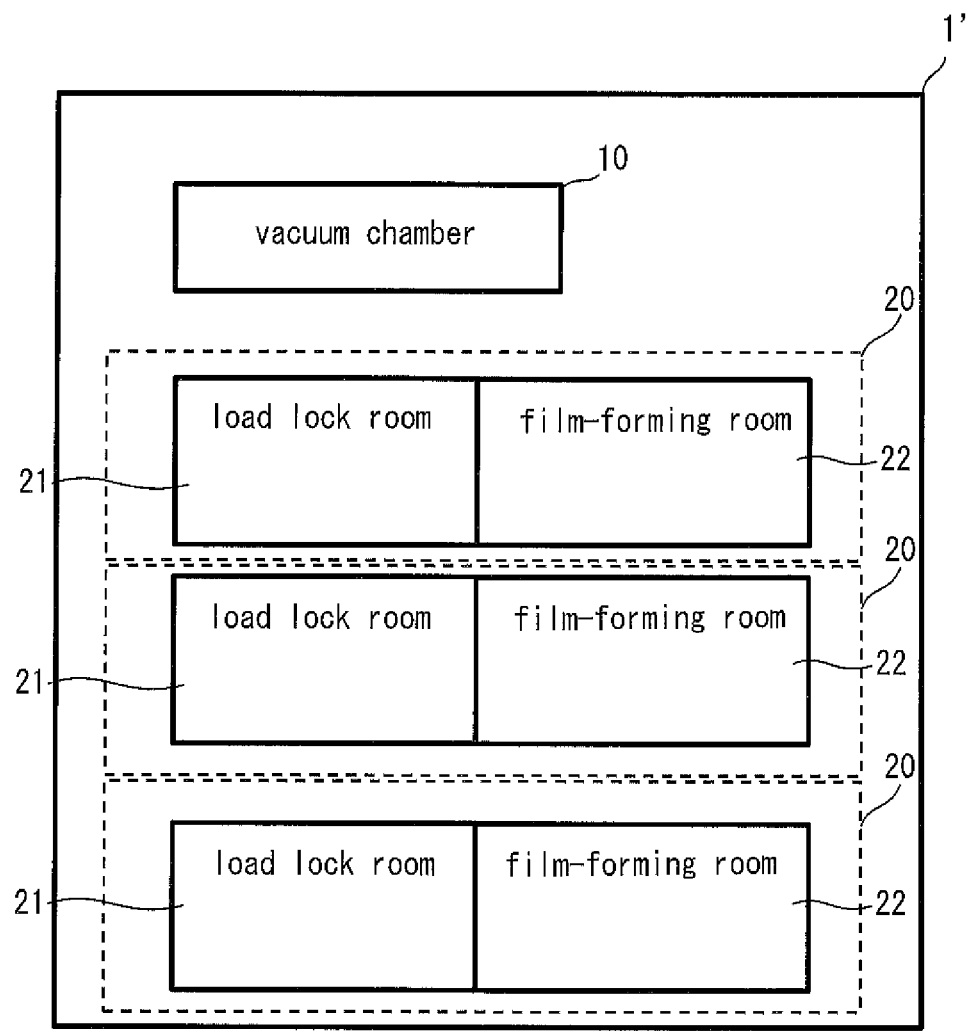
FIG. 16 is a schematic view illustrating a configuration example of a load lock room and a film-forming room in a modified example (2).

(2) Though an example in which the film-forming apparatus 1 includes one vacuum chamber 10, one load lock room 21, and one film-forming room 22 has been described in the first embodiment above, a plurality of load lock rooms 21 and a plurality of film-forming rooms 21 may be provided as illustrated in FIG. 16. Such a configuration makes it possible to perform film-forming processing for a plurality of substrates in parallel. Further, even in such a case, each of the plurality of load lock rooms 21 and the plurality of film-forming rooms 22 does not need to have the jig with the magnet 32, so that cost required for the jig with the magnet 32 is able to be reduced.

Figure 17A:
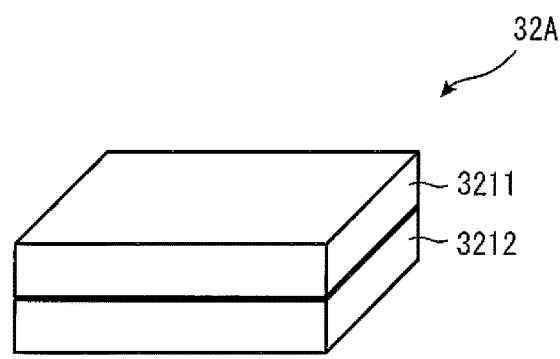
FIG. 17A is a schematic view illustrating a configuration example of a jig with a magnet in a modified example (3).
Figure 17B:
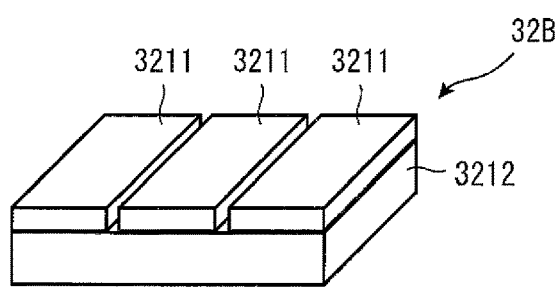
FIG. 17B is a schematic view illustrating a configuration example of a jig with a magnet in the modified example (3).
Figure 17C:
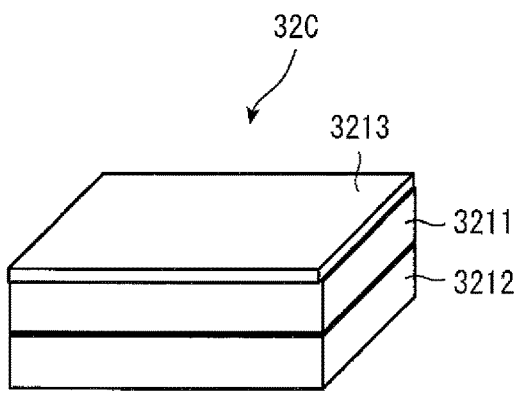
FIG. 17C is a schematic view illustrating a configuration example of a jig with a magnet in the modified example (3).

(3) In the first to fourth embodiments and the application examples described above, the jig with the magnet 32 may be configured as illustrated in any of FIGS. 17A to 17C. FIGS. 17A to 17C are schematic views each illustrating a schematic configuration of a jig with a magnet.

In an example illustrated in FIG. 17A, a jig with a magnet 32A is constituted by a magnet member 3211 and a non-magnetic plate 3212 each having a rectangular shape. In an example illustrated in FIG. 17B, a jig with a magnet 32B includes three magnet members 3211 and the non-magnetic plate 3212.

In FIGS. 17A and 17B, each of the jigs with the magnets 32A and 32B has a structure in which the magnet member 3211 is laminated on the non-magnetic plate 3212. The magnet member 3211 and the non-magnetic plate 3212 may be bonded by adhesive or may be fixed with use of a fixing tool or the like.

The magnet member 3211 is formed by, for example, a neodymium magnet, a ferrite magnet, a samarium cobalt magnet, or the like, and has a predetermined magnetic force and durability. The magnet member 3211 is only required to be designed so that a Curie point of the magnet member 321A is higher than a temperature at a film-forming step. The non-magnetic plate 3212 is formed by a material such as glass, ceramic, or non-magnetic metal, and has a predetermined rigidity and durability.

Note that, configurations of the magnet member 3211 and the non-magnetic plate 3212 are not limited to the configurations illustrated in FIGS. 17A and 17B. The magnet member 3211 may be formed by one or more magnet members, and the non-magnetic plate 3212 may be formed by one or more non-magnetic plates.

A jig with a magnet 32C illustrated in FIG. 17C includes a protection plate 3213 that has a rectangular shape in addition to the magnet member 3211 and the non-magnetic plate 3212 illustrated in FIG. 17A, and is configured so that the non-magnetic plate 3212, the magnet member 3211, and the protection plate 3213 are laminated in this order. Note that, the protection plate 3213 may also cover side surfaces of the magnet member 3211 and the non-magnetic plate 3212.

The protection plate 3213 is formed by a material, for example, such as non-magnetic metal or glass. By providing the protection plate 3213 on the magnet member 3211, it is possible to prevent degradation or contamination due to abrasion of a surface of the magnet member 3211. It is desired that the protection plate 3213 is mechanically fixed to the magnet member 3211 and the non-magnetic plate 3212 by a screw or the like. Such a configuration makes it possible to replace the protection plate 3213 in accordance with a degree of abrasion or a contamination state. It is also desired that the protection plate 3213 is formed by a material which requires lower cost than the magnet member 3211. Such a configuration makes it possible to reduce cost for replacing the protection plate 3213.

Note that, though an example in which the jig with the magnet has a rectangular shape has been illustrated in each of FIGS. 17A to 17C above, a shape of the jig with the magnet is not limited thereto. For example, a circular shape or a polygonal shape may be used.

(4) Though an example in which an external force is applied by using the jig with the magnet has been described as a configuration in which an external force is applied in a direction in which the substrate and the member in contact with one surface of the substrate are stacked in the first to fourth embodiments and the application examples above, the configuration for applying the external force is not limited thereto. For example, mechanical pressing may be performed in the direction in which the substrate and the member in contact with one surface of the substrate are stacked.

The invention claimed is:

1. A film-forming method for forming a thin film on a substrate, the method comprising:
   a contact step of stacking the substrate and a member in contact with one surface of the substrate and placing the substrate and the member vacuum while an external force generated by a magnet is applied in a direction in which the substrate and the member are stacked;
   an external force removal step of removing the external force by separating the magnet from the member at atmospheric pressure or under vacuum; and
   a film-forming step of forming a thin film on the one surface or the other surface of the substrate after the external force removal step.

2. The film-forming method according to claim 1, wherein the member is a metal mask having an opening,
   at the contact step, the magnet is arranged on a side of the other surface of the substrate and the external force is applied while the substrate is held between the metal mask and the magnet,
   at the external force removal step, the external force is removed by separating the magnet and the metal mask, and
   at the film-forming step, the thin film is formed in a region of the one surface of the substrate, the region corresponding to an area where the opening of the metal mask is provided.

3. The film-forming method according to claim 2, wherein at the contact step, a non-magnetic member is further arranged in a stacked manner to contact the other surface of the substrate, and the external force is applied in a direction in which the metal mask, the substrate, and the non-magnetic member are stacked while the substrate and the non-magnetic member are held between the metal mask and the magnet.

4. The film-forming method according to claim 2, wherein at the film-forming step, the thin film is formed on the one surface of the substrate by using a chemical vapor deposition method, and
   the magnet and the metal mask are separated at the external force removal step before the film-forming step.

5. The film-forming method according to claim 1, wherein the member is a non-magnetic member made of a non-magnetic material,
   at the contact step, a magnetic member is further arranged in a stacked manner to contact the other surface of the substrate, the magnet is arranged to contact the non-magnetic member, and the external force is applied in a direction in which the magnetic member, the substrate, and the non-magnetic member are stacked while the substrate and the non-magnetic member are held between the magnet and the magnetic member,
   at the external force removal step, the external force is removed by separating the magnetic member and the magnet from the substrate and the non-magnetic member, and
   at the film-forming step, the thin film is formed on the other surface of the substrate.

* * * * *